(12) United States Patent
Mehmandoust

(10) Patent No.: US 6,729,040 B2
(45) Date of Patent: May 4, 2004

(54) APPARATUS AND METHOD FOR DRYING A SUBSTRATE USING HYDROPHOBIC AND POLAR ORGANIC COMPOUNDS

(75) Inventor: Yassin Mehmandoust, Santa Cruz, CA (US)

(73) Assignee: Oliver Design, Inc., Scotts Valley, CA (US)

( * ) Notice: Subject to any disclaimer, the term of this patent is extended or adjusted under 35 U.S.C. 154(b) by 0 days.

(21) Appl. No.: 09/802,392

(22) Filed: Mar. 9, 2001

(65) Prior Publication Data

US 2001/0047595 A1 Dec. 6, 2001

Related U.S. Application Data

(63) Continuation-in-part of application No. 09/579,837, filed on May 26, 2000.
(60) Provisional application No. 60/136,635, filed on May 27, 1999.

(51) Int. Cl.[7] .............................. F26B 3/00; F26B 21/06
(52) U.S. Cl. ............................. 34/443; 34/330; 34/340; 34/342; 34/351; 34/78
(58) Field of Search .................. 34/329, 330, 337, 34/340, 342, 343, 351, 357, 358, 443, 524, 585, 582, 72, 78

(56) References Cited

U.S. PATENT DOCUMENTS

| | | | | |
|---|---|---|---|---|
| 5,183,067 A | * | 2/1993 | Slinn | 134/61 |
| 5,715,612 A | * | 2/1998 | Schwenkler | 34/470 |
| 5,752,532 A | * | 5/1998 | Schwenkler | 134/102.3 |
| 5,772,784 A | * | 6/1998 | Mohindra et al. | 134/21 |
| 5,974,689 A | * | 11/1999 | Ferrell et al. | 34/340 |
| 5,985,041 A | * | 11/1999 | Florez | 134/2 |
| 6,027,574 A | * | 2/2000 | Fishkin et al. | 134/30 |
| 6,119,366 A | * | 9/2000 | Ferrell et al. | 34/340 |
| 6,128,830 A | * | 10/2000 | Bettcher et al. | 34/404 |
| 6,158,446 A | * | 12/2000 | Mohindra et al. | 134/25.4 |
| 6,334,266 B1 | * | 1/2002 | Moritz et al. | 34/337 |
| 6,401,353 B2 | * | 6/2002 | Kimura | 34/72 |
| 6,405,452 B1 | * | 6/2002 | Twu et al. | 34/467 |
| 6,412,501 B1 | * | 7/2002 | Onoda et al. | 134/95.2 |
| 6,430,840 B1 | * | 8/2002 | Jung | 34/468 |
| 2001/0029683 A1 | * | 10/2001 | Murphy et al. | 34/471 |
| 2002/0032973 A1 | * | 3/2002 | Jung | 34/467 |

FOREIGN PATENT DOCUMENTS

JP 0496899 A1 * 8/1992 ........... B01D/12/00

* cited by examiner

Primary Examiner—Kenneth B. Rinehart
(74) Attorney, Agent, or Firm—Jacques M. Dulin, Esq; Innovation Law Group

(57) ABSTRACT

A dryer for drying a substrate includes: a bath containing a fluid; a chamber; and a delivery system supplying a polar organic compound, such as isopropyl alcohol, and a hydrophobic organic compound, such as hydrofluoroether, to the interface between the substrate and the fluid as the substrate is removed from the fluid of the bath into the chamber. The dryer further includes a chamber environment control system that supplies a gas into the chamber to dry the substrate and controls temperature and humidity in the chamber and a chamber heater attached to the chamber to transfer thermal energy into the chamber. A drying method includes: immersing a substrate into a fluid contained in a bath; removing the substrate from the fluid into a chamber; and supplying isopropyl alcohol and hydrofluoroether to an interface between the substrate and the fluid. The method further includes: supplying a gas into the chamber to dry the substrate and to control temperature and humidity in the chamber; and heating the chamber to transfer thermal energy into the chamber and the substrate.

60 Claims, 20 Drawing Sheets

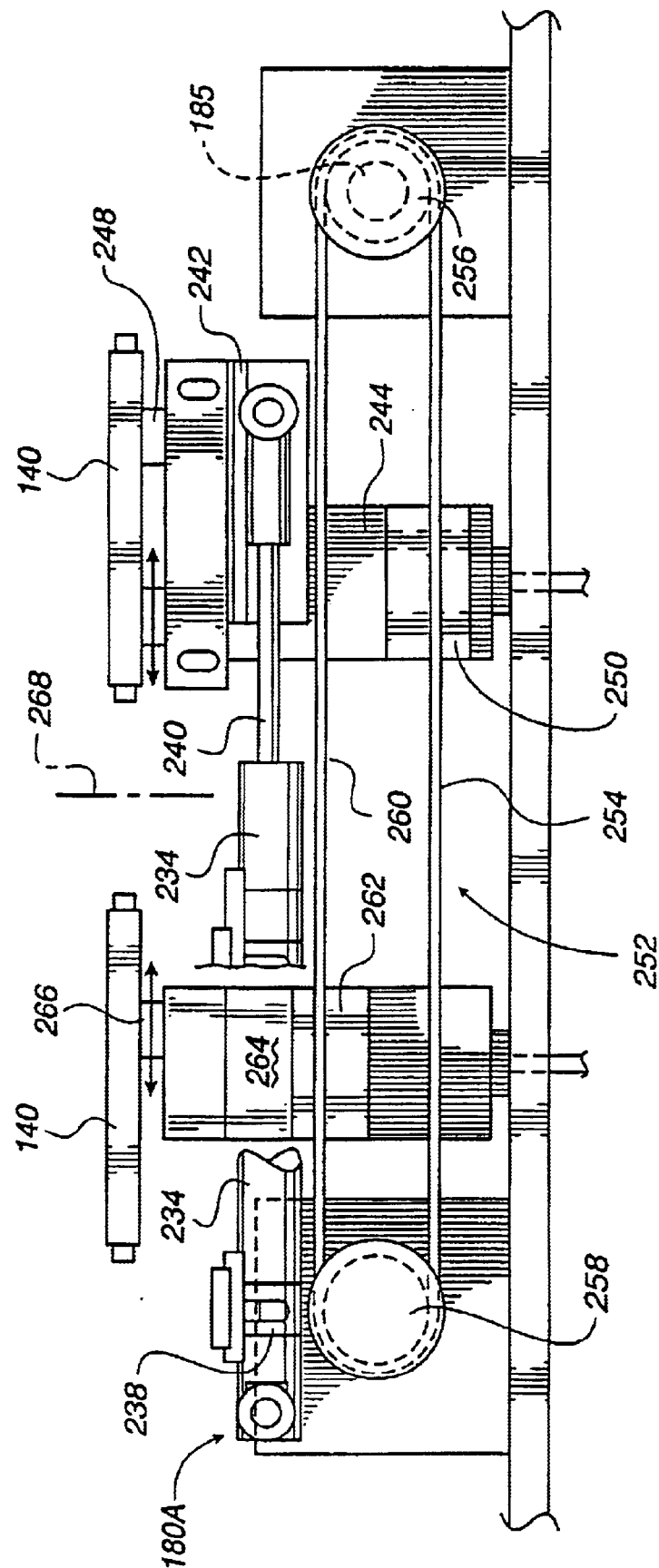

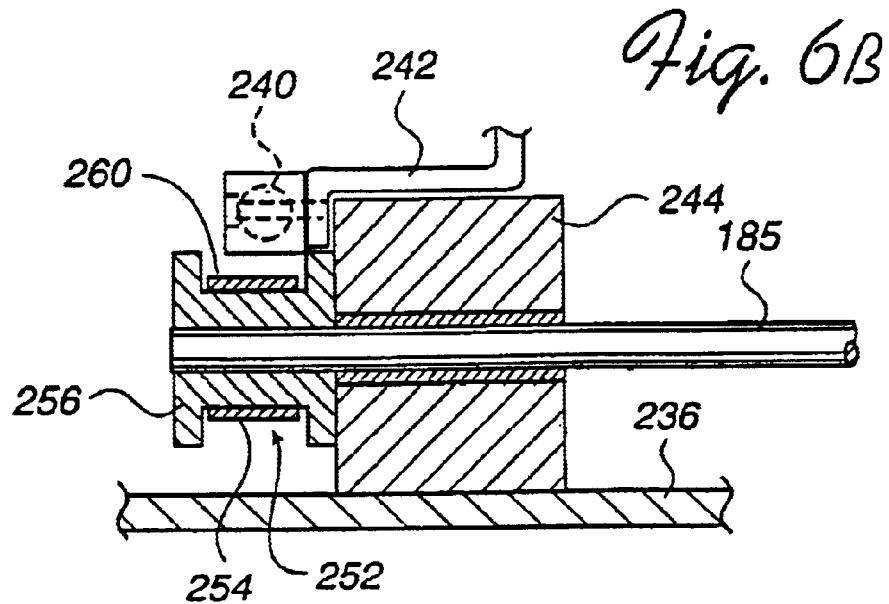
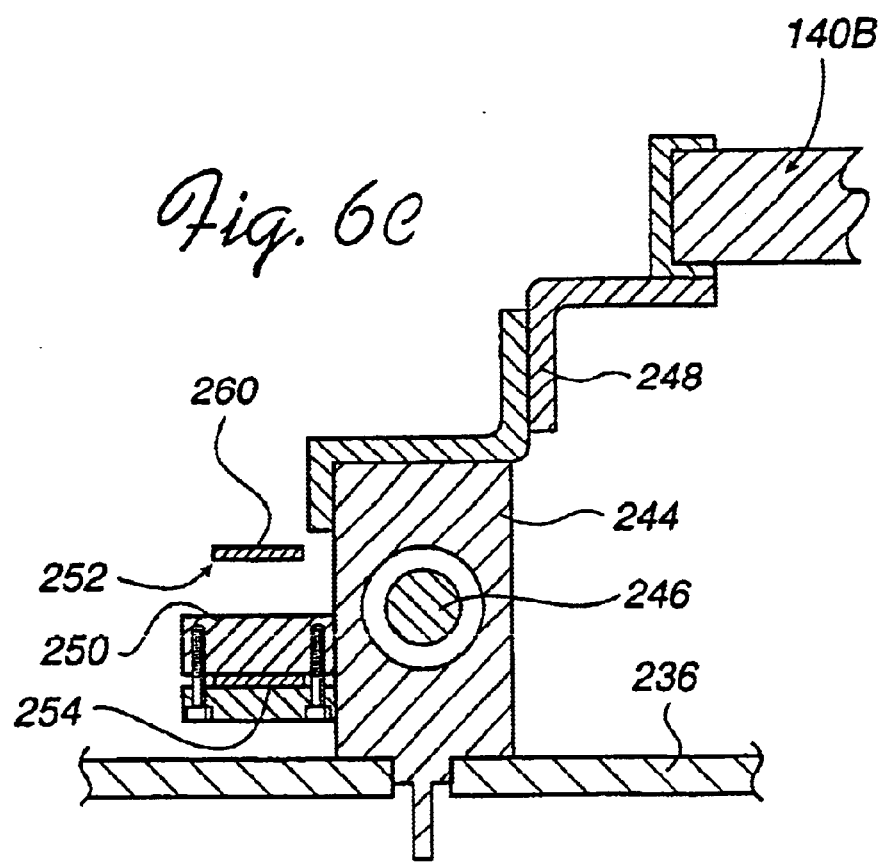

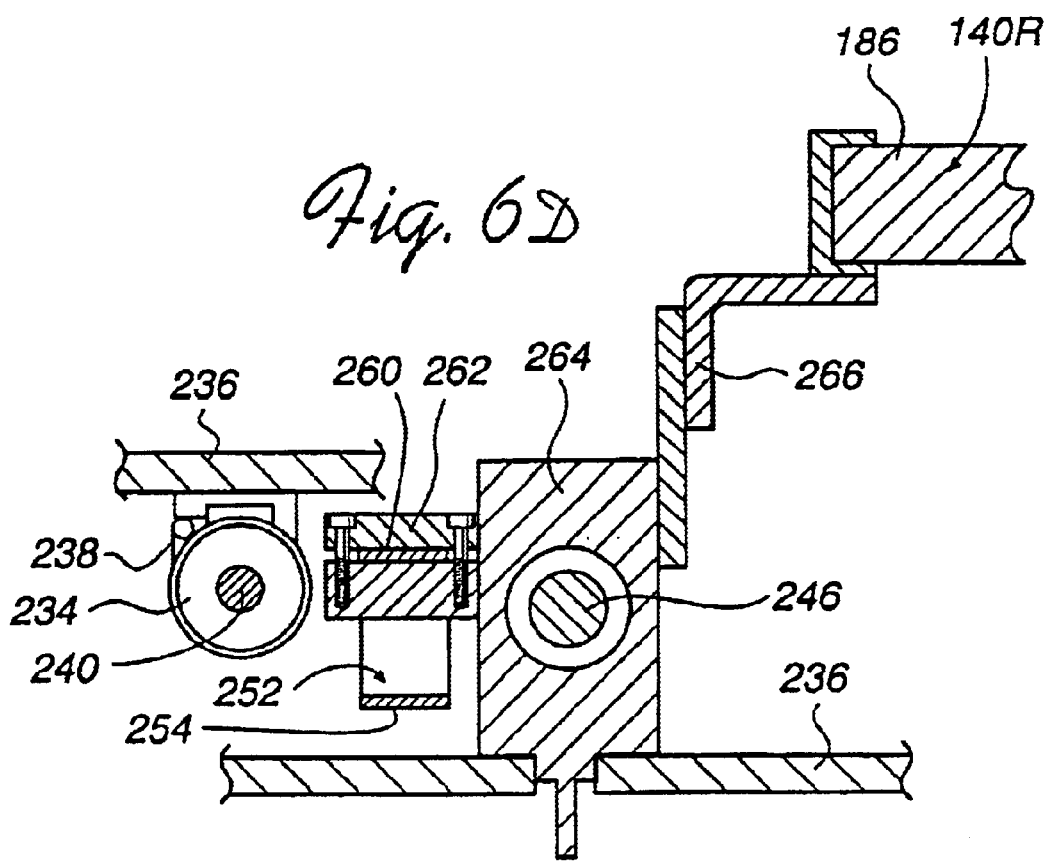

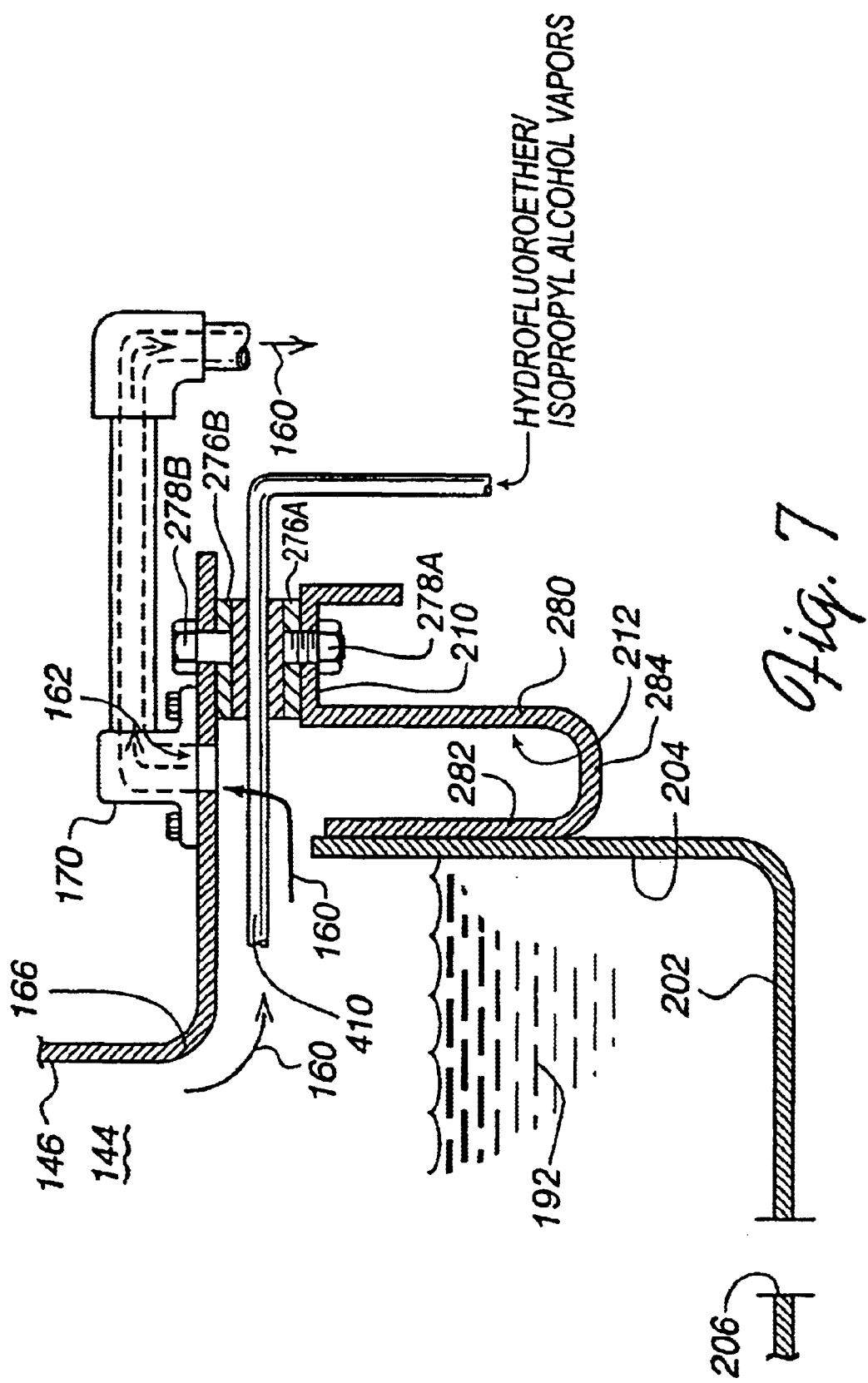

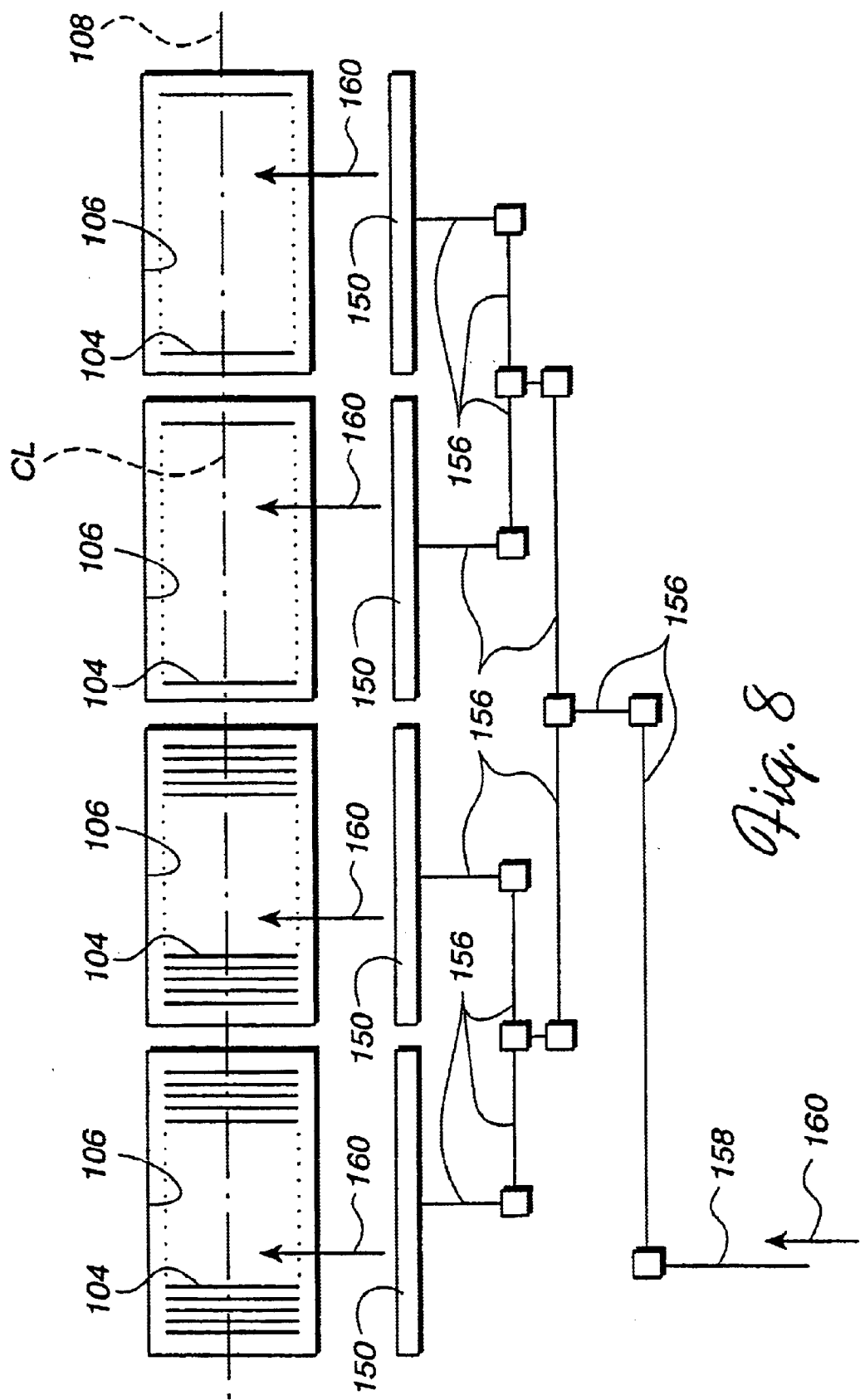

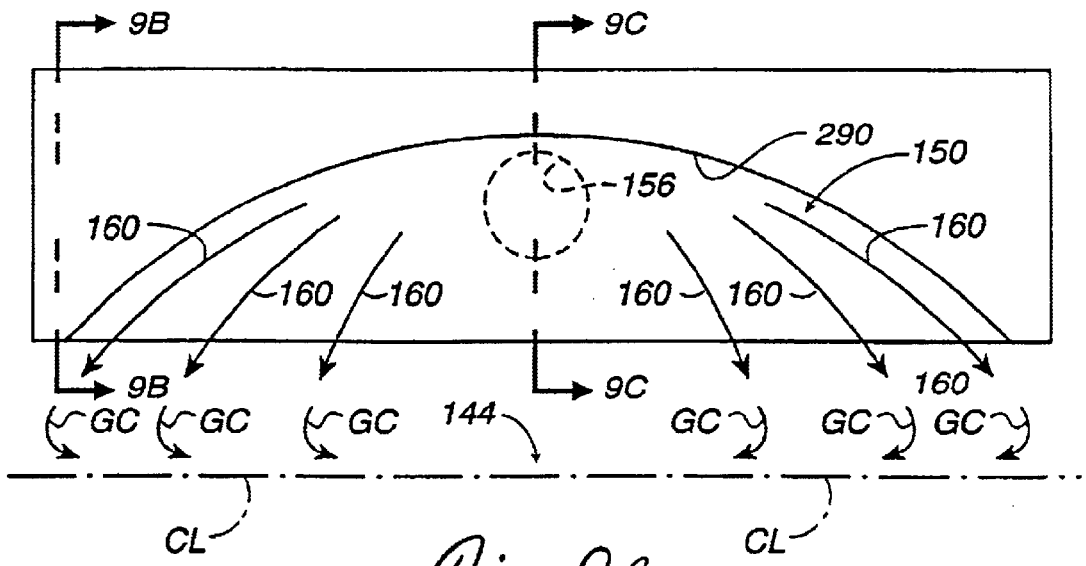
Fig. 9A
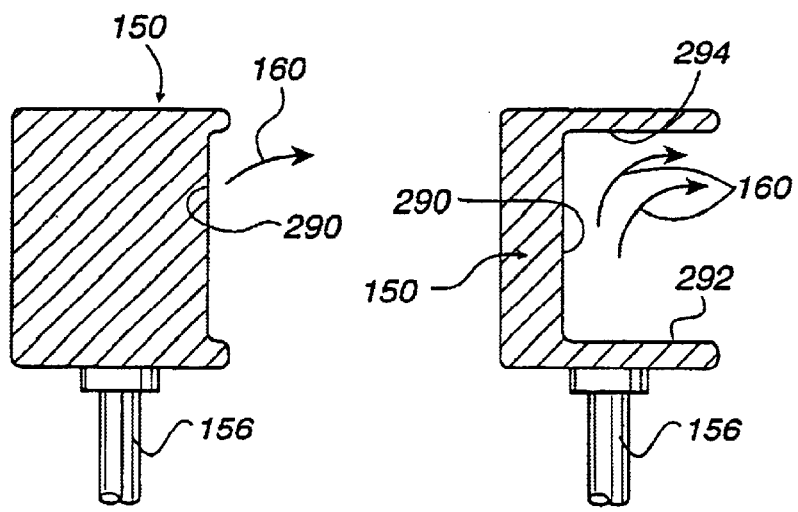
Fig. 9B
Fig. 9C

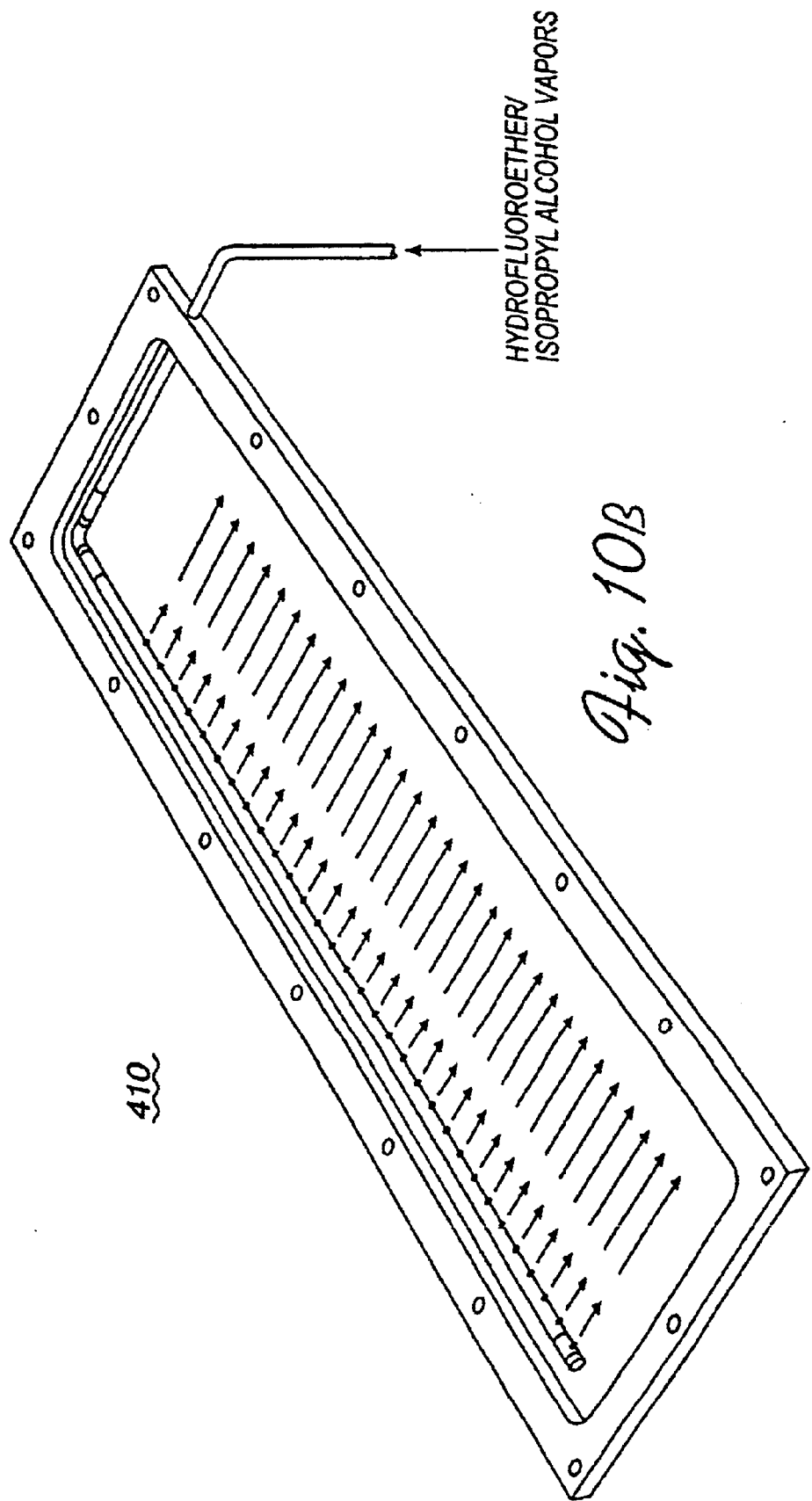

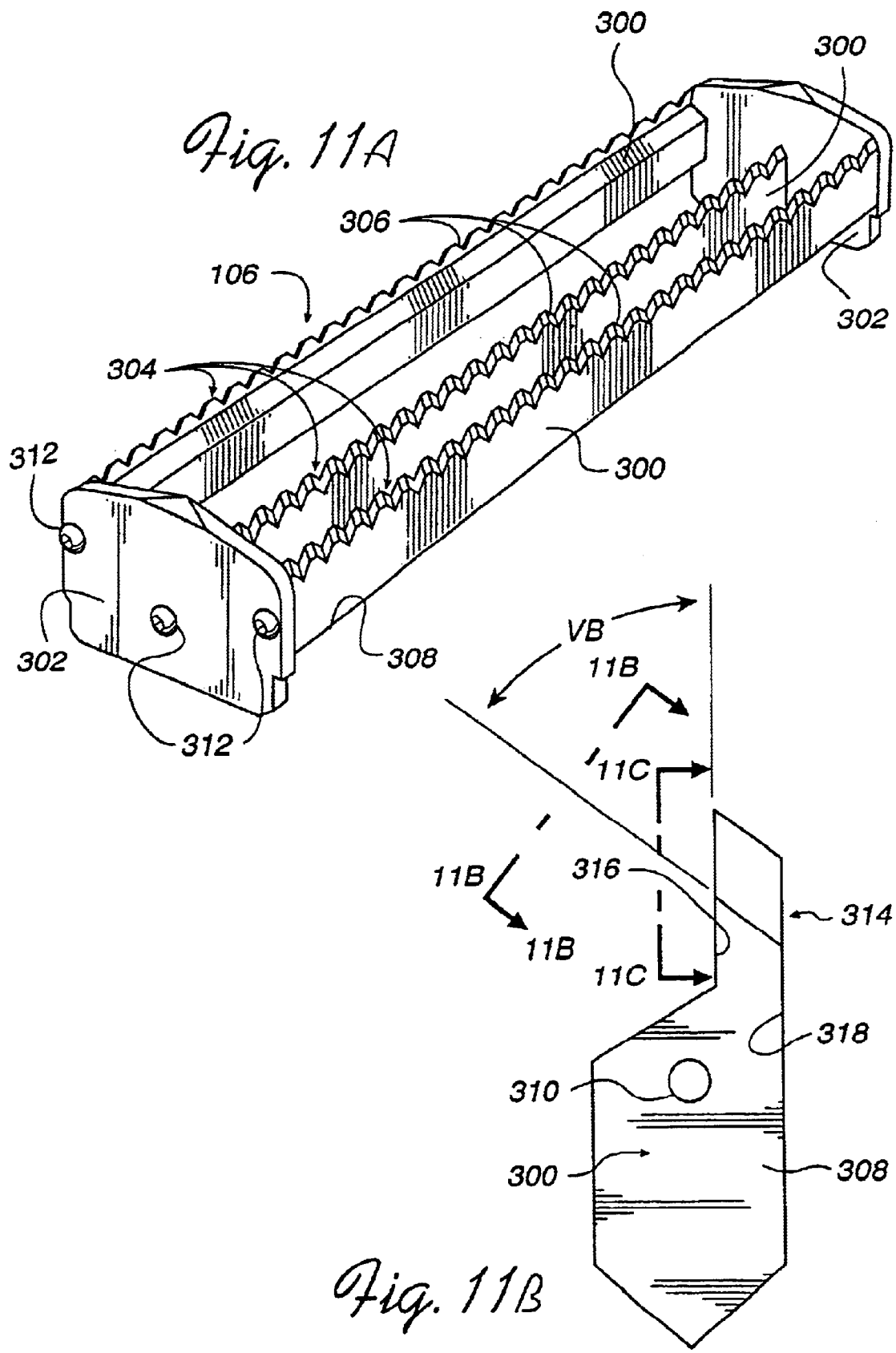

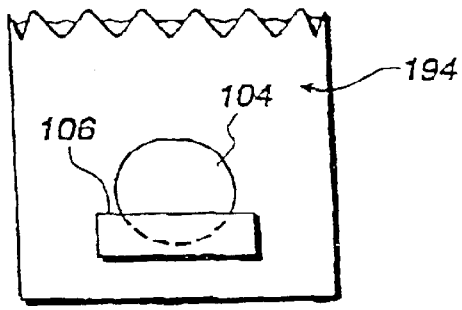
DEEP
IMMERSION
Figure 15A
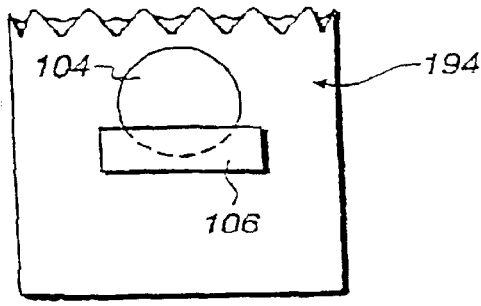
SHALLOW
IMMERSION
Figure 15B
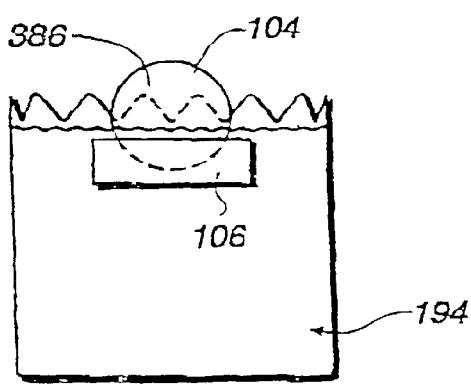
Figure 15C
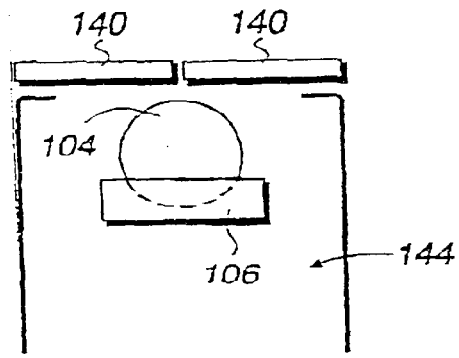
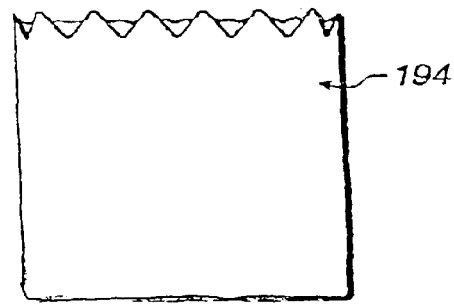
Figure 15D

APPARATUS AND METHOD FOR DRYING A SUBSTRATE USING HYDROPHOBIC AND POLAR ORGANIC COMPOUNDS

CROSS REFERENCE TO RELATED APPLICATION

This application is a continuation-in-part application of U.S. patent application Ser. No. 09/579,837, filed May 26, 2000 entitled "APPARATUS AND METHOD FOR DRYING BATCHES OF DISKS", which claims priority from U.S. Provisional Patent Application No. 60/136,635 filed May 27, 1999, entitled "NEXT GENERATION MODULAR DISK CLEANING SYSTEM INCLUDING TRANSFER, IMMERSION, CASCADE BRUSH SCRUBBER AND DRYER ASSEMBLIES". The U.S. patent application Ser. No. 09/579,837 is incorporated herein by reference in its entirety.

This application is related to and incorporates by reference co-filed U.S. patent application Ser. No. 09/717,163 entitled "APPARATUS AND METHOD FOR DRYING A THIN SUBSTRATE".

BACKGROUND

The present invention relates to an apparatus and a method for drying a substrate and more particularly, to an apparatus and a method for drying a disk for a data storage device (hard drive) by controlled delivery of a polar organic compound, such as isopropyl alcohol (IPA), acetone, or methanol, and a hydrophobic organic compound, such as hydrofluoroether.

In the manufacture of LCD (liquid crystal display) panels, and hard drives, it is necessary to clean and dry the substrates for the above products, such as glass substrates, and disks, during the manufacturing process. The purpose of drying the substrates is to remove water on the substrates after cleaning. Currently several drying methods are being used in the electronic component industry. The methods include the spin-rinse dry method, the hot water slow pull method, the Marangoni-type process, the hot IPA process, and the hydrofluoroether process.

The spin-rinse dry uses centrifugal forces to remove water from substrate surfaces. However, spin-rinse dry is known to have problems such as water spotting, static electric charge build-up, and stress-induced substrate damage.

In the hot water slow pull method, the substrates are immersed in a hot water bath, which is heated to 80–90° C., and then slowly pulled from the bath. When a substrate is pulled from the bath, a thin water film is formed on the surface of the substrate. Then, the thermal energy stored in the substrate evaporates the thin water film. For successful evaporation, the rate at which the substrate is separated from the bath must be matched to the evaporation rate. The hot water process has several shortcomings. When the substrate has a non-homogeneous surface, partly hydrophobic and partly hydrophilic, the substrate is likely to have stains thereon. Further, condensation of water vapor on the substrate after the substrate is pulled from the hot water may produce stains on the substrate.

The hot IPA process uses a large quantity of IPA, which is flammable, to fill the drying chamber. Accordingly, the hot IPA process is costly and environmentally unsafe.

The Marangoni-type process involves the introduction of a polar organic compound which dissolves in the liquid and thereby reduces the surface tension of the liquid. U.S. Pat. No. 6,027,574, entitled "METHOD OF DRYING A SUBSTRATE BY LOWERING A FLUID SURFACE LEVEL", shows a Marangoni-type process. According to the Marangoni principle, fluid flows from low surface tension region to high surface tension region. In the Marangoni-type process, while the substrate is separated from the bath containing water that is at room temperature, the water is driven away from the substrate because of the Marangoni effect. To avoid condensation of water vapor on the surface of the substrate, the Marangoni-type process does not use hot water.

There are several issues with the conventional Marangoni-type process. First, the drying speed of the process is low, because the substrate is dried at room temperature, and the chamber is purged of IPA vapor remaining in the chamber after drying process for an extended period of time (3–5 minutes). Accordingly, the drying cost is high. Second, although room temperature water is used, there is still a condensation problem during and after the separation of the substrate from the water. Water vapor may condense on the substrate and form micro droplets that leave a residue behind, causing defects in subsequent manufacturing processes. Fourth, purging of IPA while the substrate is dried in the chamber may cause condensation of water vapor. Finally, although the conventional Marangoni-type process is safer than the hot IPA process, the quantity of IPA used in the conventional Marangoni-type process is still large enough to make the process environmentally unsafe.

The hydrofluoroether process uses hydrofluoroether as a drying agent. U.S. Pat. No. 6,119,366, entitled "CHEMICAL DRYING AND CLEANING METHOD", shows a hydrofluoroether process. Since this process uses only hydrofluoroether to directly displace water, the quantity of hydrofluoroether used in the drying process must be large, and thus the used hydrofluoroether needs to be recycled for reducing cost.

Accordingly, an effective drying process should be cost-effective, and should be environmentally safe, and should prevent the condensation of water on the substrate.

SUMMARY

An aspect of the present invention provides a substrate dryer. A dryer in accordance with an embodiment of the present invention includes: a bath containing a fluid; a chamber; and a delivery system for supplying a polar organic compound, such as isopropyl alcohol, acetone, or methanol, and a hydrophobic organic compound, such as hydrofluoroether, perfluorocarbon, or hydrofluocarbon. The delivery system supplies isopropyl alcohol vapor and hydrofluoroether vapor to an interface between the substrate and the fluid while the substrate is being removed from the fluid of the bath into the chamber. The interface is the boundary between a portion of the substrate out of the fluid and a portion of the substrate in the fluid. The isopropyl alcohol vapor and hydrofluoroether vapor may be combined with a carrier gas, such as nitrogen.

The dryer further includes a chamber environment control system that supplies a heated gas into the chamber to dry the substrate and exhaust remaining hydrofluoroether vapor, remaining isopropyl alcohol vapor, and water vapor. The chamber environment control system includes: a gas inlet through which the gas is supplied into the chamber; a gas outlet through which the gas is removed from the chamber; and a gas heater that heats the gas before the gas is supplied into the chamber. The chamber environment control system controls the temperature and humidity in the chamber. The gas inlet is at a top portion of the chamber, and the gas outlet is at the bottom portion of the chamber. Further, a variable speed fan is connected to the gas outlet to draw the gas from the chamber.

The dryer further includes a fluid circulation system that circulates the fluid in the bath and a substrate transfer system that transfers the substrate into and out of the fluid of the bath. The fluid circulation system includes: a pump for circulating the fluid into and out of the bath; and a filter through which the fluid from the bath passes before being supplied into the bath. The substrate transfer system includes: a nest containing the substrate therein; and an arm that moves so that the substrate in the nest is immersed into and removed from the fluid of the bath.

The dryer further includes: a chamber heater attached to the chamber to transfer thermal energy into the chamber and an overflow tank for receiving overflow of the fluid from the bath; a fluid heater to heat the fluid in the bath; and a condenser unit. The condenser unit condenses exhausted hydrofluoroether vapor, isopropyl alcohol vapor, and water vapor to liquid for proper disposal.

Another aspect of the present invention provides a method of drying a substrate. A drying method in accordance with the present invention includes: immersing a substrate into a fluid contained in a bath; removing the substrate from the fluid into a chamber; and supplying a polar organic compound, such as isopropyl alcohol vapor, and a hydophobic organic compound, such as hydrofluoroether, to an interface between the substrate and the fluid.

Introduction of the isopropyl alcohol vapor forms a thin layer of a mixture of isopropyl alcohol vapor and fluid at the interface, increasing the wettability of substrate and promoting removal of the fluid when the substrate is removed from the fluid. Hydrofluoroether assists repelling of the fluid and forms a thin hydrofluoroether film on the surface of the substrate to prevent condensation of water vapor on the substrate.

The method further includes: supplying a gas into the chamber to dry the substrate; heating the gas before supplying the gas into the chamber; and removing the gas. While the gas is removed, the water vapor and the remaining isopropyl alcohol and hydrofluoroether vapor are also removed.

The method further includes: circulating the fluid into and out of the bath; heating the fluid; and filtering the fluid before the fluid is supplied into the bath. The method further includes heating the chamber to transfer thermal energy into the chamber.

BRIEF DESCRIPTION OF THE DRAWINGS

FIGS. 6A to 6D illustrate a door opening mechanism of the dryer of FIG. 1.

FIG. 7 is an enlarged cross-sectional view of the connection between the chamber and the tank of the dryer of FIG. 1.

FIG. 8 is a schematic view illustrating the gas supply system of the dryer of FIG. 1.

FIGS. 9A to 9C illustrate a gas inlet of the dryer of FIG. 1.

FIG. 10B is a perspective view of the manifold for the organic compound delivery system of FIG. 10A.

FIGS. 11A to 11D illustrate a nest of the dryer of FIG. 1.

FIGS. 15A to 15D illustrate the movement of a disk during the drying process of the FIG. 14.

Use of the same reference symbols in different figures indicates similar or identical items.

DETAILED DESCRIPTION

The present invention is directed to a dryer or cleaner and dryer for a substrate used in electronic component manufacturing, especially for the substrates used in manufacturing LCD panels and hard disks. The invention is further directed to a method for cleaning and drying the substrates.

A dryer in accordance with the present invention includes a bath, a chamber, an organic compound delivery system, gas inlets and outlets, a fluid heater, and a chamber heater. Substrates are immersed in the bath containing a fluid, such as de-ionized water, and pulled from the bath to the chamber, which is above the bath. While the substrates are pulled, the delivery system provides a mixture of isopropyl alcohol and hydrofluoroether carried with a carrier gas, such as nitrogen, to the interface between the substrates and the water in order to promote the removal of the water from the substrates and prevent condensation of water vapor on the substrates. The interface is the boundary between a portion of the substrate out of the water and a portion of the substrate in the water. Through the gas inlets and outlets, hot gas flows through the chamber to dry the substrates. The heater is attached to the chamber to control the temperature of the chamber. The water is heated to promote the substrate drying.

The present invention can be applied to LCD panel fabrication, hard disk fabrication, and other electronic component manufacturing that uses substrates. However, for the illustrative purposes, the embodiments of the invention that are described below are explained for disk fabrication. In addition, although the embodiments use isopropyl alcohol vapor to promote the substrate drying, other polar organic compounds, such as acetone or methanol, can be used instead of the isopropyl alcohol vapor. Likewise, hydrofluoroether vapor used in the embodiments can be replaced with another hydrophobic organic compound, such as perfluorocarbon, or hydrofluorocarbon.

For producing the hydrofluoroether vapor, hydrofluoroether liquids, such as models HFE, HFE-71DA, HFE-4310-smt, and HFE-7200 from 3M, St. Paul, Minn., can be used. For producing perfluorocarbon vapor, models PF5060 and PF5070 from 3M, St. Paul, Minn., can be used. For producing hydrofluorocarbon vapor, models Vertrel XF, Vertrel XP, Vertrel XE, and Vertrel XM from DuPont, Wilmimgton, Del., and model AK-225 from Asahi Glass in Tokyo, Japan, can be used.

Figure 1:
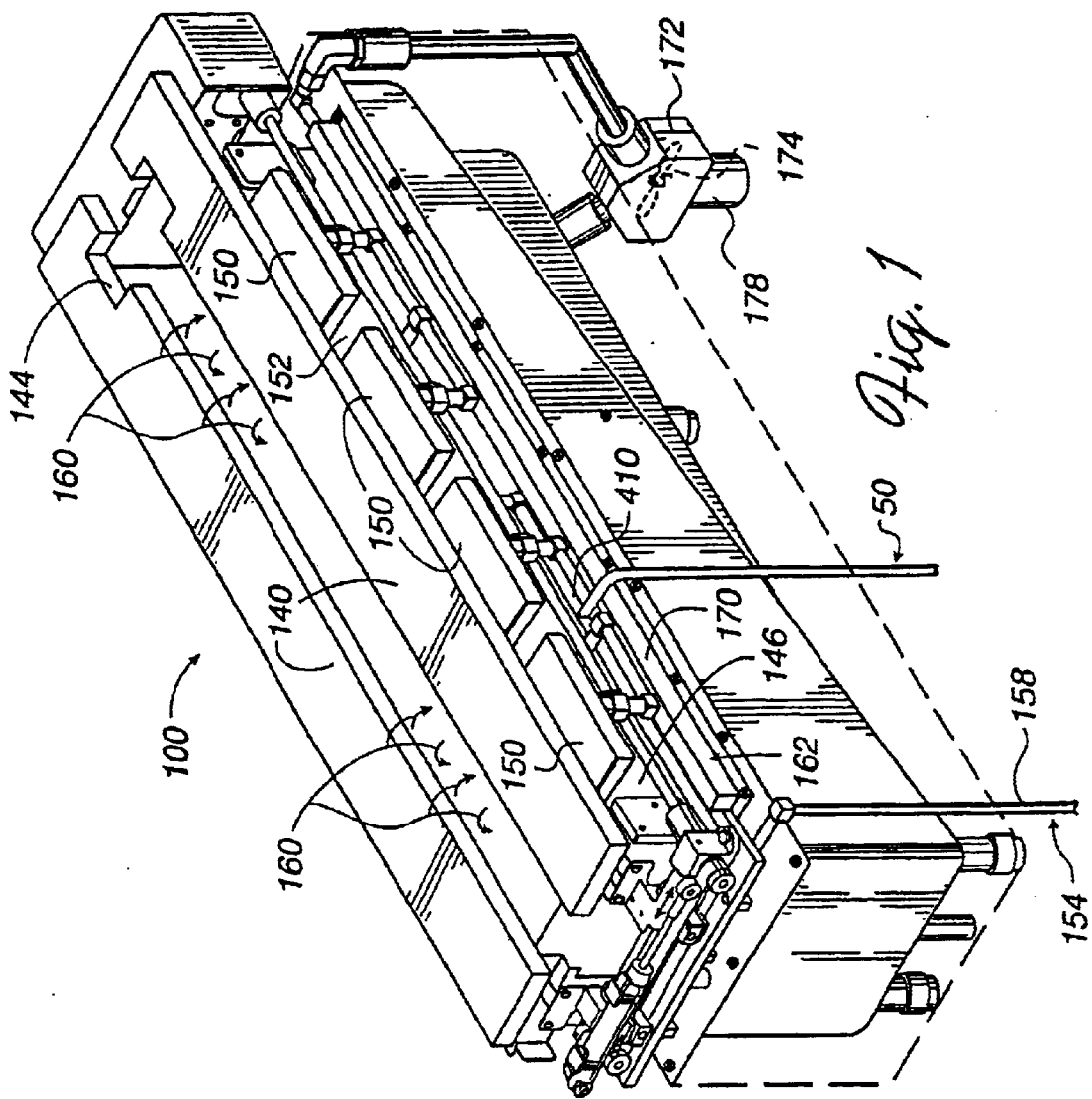
FIG. 1 is a perspective view of a dryer in accordance with an embodiment of the present invention.
Figure 2:
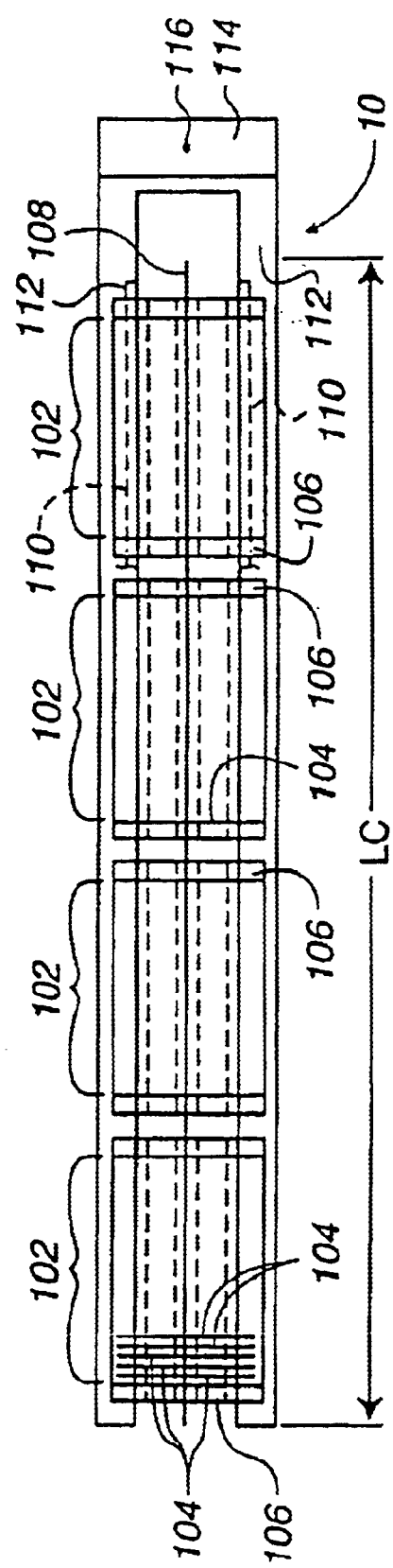
FIG. 2 is a top view of a disk carrying system of the dryer of FIG. 1.
Figure 3:
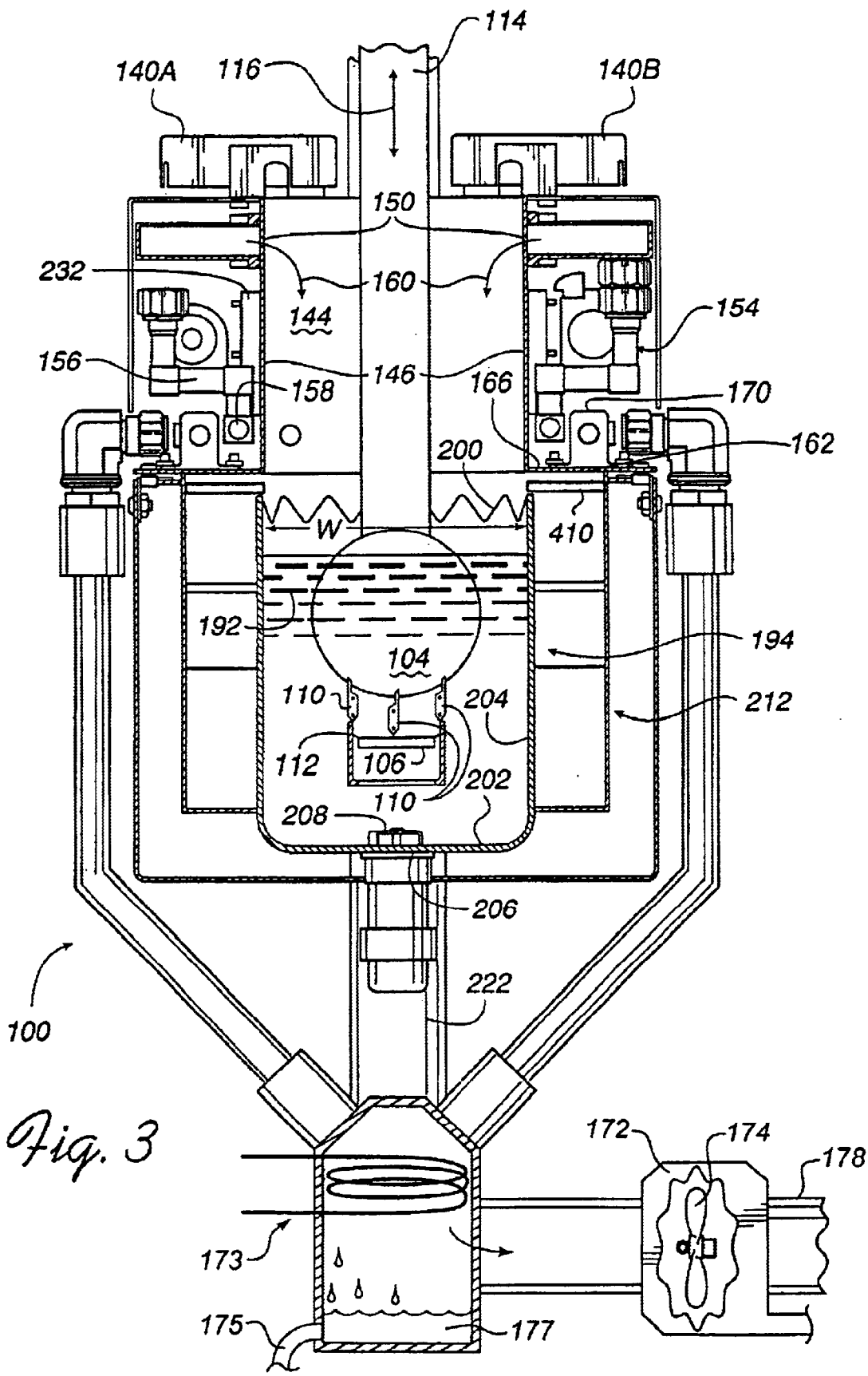
FIG. 3 is a transverse cross-sectional view of the dryer of FIG. 1.
Figure 4:
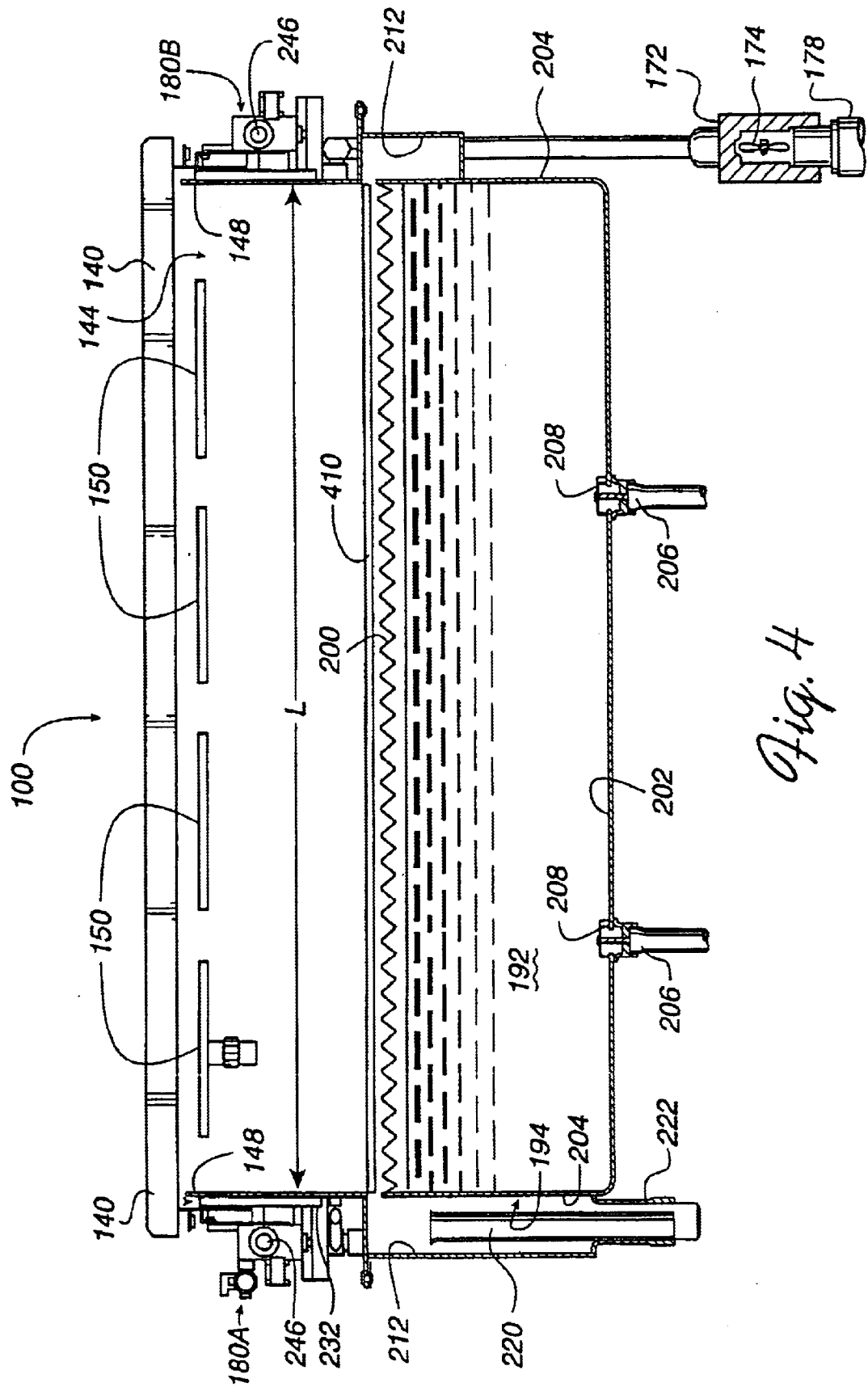
FIG. 4 is a longitudinal cross-sectional view of the dryer of FIG. 1.

FIGS. 1, 3, and 4 illustrate a disk dryer 100 in accordance with the present invention, and FIG. 2 illustrates a disk carrying system 10 of dryer 100. Disk carrying system 10 carries four batches 102 of disks 104. Each of batches 102 is carried in a nest 106. Although disk carrying system 10 has four nests 106, the number of nests 106 can be adjusted according to manufacturing environment.

Referring to FIGS. 2 and 3, four nests 106 are aligned on a horizontal disk drying axis 108. Each nest 106 has three parallel fingers 110 to support disks 104, and bifurcated horizontal arms 112 cantilevered from a main drive column 114 support nests 106. Arms 112 have a length LC sufficient to carry four nests 106. Main drive column 114 moves up and down along a vertical axis 116, so that arms 112 move up and down to move disks 104 during a drying operation.

Referring to FIGS. 1 to 4, dryer 100 includes disk carrying system 10, a bath 194, a chamber 144, a gas supply system 154, and an organic compound delivery system 50. Disk carrying system 10 loads disks 104 in nests 106 from the top of chamber 144 through door 140 into bath 194 that contains a fluid such as water 192. Preferably, water 192 is de-ionized and filtered water. Further, water 192 is heated before being provided into bath 194. Then, disk carrying system 10 pulls disks 104 from bath 194 into chamber 144, which is above bath 194. While disks 104 are pulled, organic compound delivery system 50 provides a mixture of isopropyl alcohol and hydrofluoroether vapor to the interface between disks 104 and water 192. Gas supply system 154 flows a heated gas 160 through chamber 144, controlling the temperature and relative humidity of the environment above bath 194 and purging the remaining isopropyl alcohol and hydrofluoroether vapor in-situ.

As described above, chamber 144 is temperature-and humidity-controlled and is defined by chamber long walls 146 and short walls 148. Length L of chamber 144 is longer than length LC of arms 112. Chamber 144 has gas inlets 150 along an upper portion 152 of long walls 146. Gas supply system 154 includes pipes 156 extending from a gas main 158 to gas inlets 150 to supply heated gas 160 to chamber 144. Gas inlets 150 are evenly spaced apart from each other to introduce gas 160 evenly into chamber 144.

Chamber 144 further includes gas outlets 162 formed at an exterior base 166, which extends perpendicularly from walls 146 and defines the bottom end of chamber 144. On each side of base 166, gas outlets 162 are covered by an exhaust manifold 170 mounted on base 166. Manifold 170 is connected to a plenum 172 that houses a variable speed fan 174.

Dryer 100 further includes a condenser 173, which is between manifold 170 and plenum 172. Condenser 173 condenses the water vapor, hydrofluoroether vapor, and isopropyl alcohol vapor exhausted through manifold 170 into a liquid 177 for a proper disposal. Liquid 177 is disposed through a drain 175. Fan 174 exhausts gas 160, the water vapor, hydrofluoroether vapor, and isopropyl alcohol vapor that were not completely condensed into an outlet pipe 178 that is connected to a main exhaust (not shown).

Organic compound delivery system 50 includes an organic compound delivery manifold 410 that supplies a mixture of hydrofluoroether vapor and isopropyl alcohol vapor to chamber 144. In order to supply the mixture, nitrogen is passed through a bubbler (not shown) that contains a mixture of liquid hydrofluoroether and liquid isopropyl alcohol and is connected to organic compound delivery manifold 410. SMR (Self-Metering Reservoir) bubbler, manufactured by iCon Dynamics, LLC in Rhinebeck, N.Y., can be used to generate the mixture to be supplied into chamber 144 via organic compound delivery manifold 410. In addition, the operation of the SMR bubbler is explained in detail in U.S. Pat. Nos. 5,921,428, 5,938,985, and 6,019,114, which are herein incorporated by reference in their entireties. Organic compound delivery manifold 410 is between bath 194 and chamber 144 along two longitudinal sides of dryer 100, so that the mixture is supplied as vapor mixed with nitrogen to disks 104.

Even though, in this embodiment, hydrofluoroether and isopropyl alcohol are supplied as a mixture into chamber 144, hydrofluoroether and isopropyl alcohol can be supplied into chamber 144 through separate bubblers and separate delivery manifolds. An exemplary content ratio of polar organic compound to hydrophobic organic compound is between 1:999 (0.1%) and 1:9 (10%). A preferred ratio of isopropyl alcohol to hydrofuoroether is between 1:49 (2%) and 1:19 (5%).

Bath 194 is composed of sidewalls 204 and a bottom 202. An upper portion 200 of sidewalls 204 has a saw-toothed configuration. As described above, chamber 144 is above bath 194 and is spaced apart from upper portion 200 of sidewalls 204. Bath 194 further includes two fluid inlets 206 at bottom 202 of bath 194. Through fluid inlets 206, water 192 is supplied to bath 194, and fluid inlets 206 are provided with diffuser plates 208, which evenly spread water 192 that is supplied to bath 194.

Figure 13:
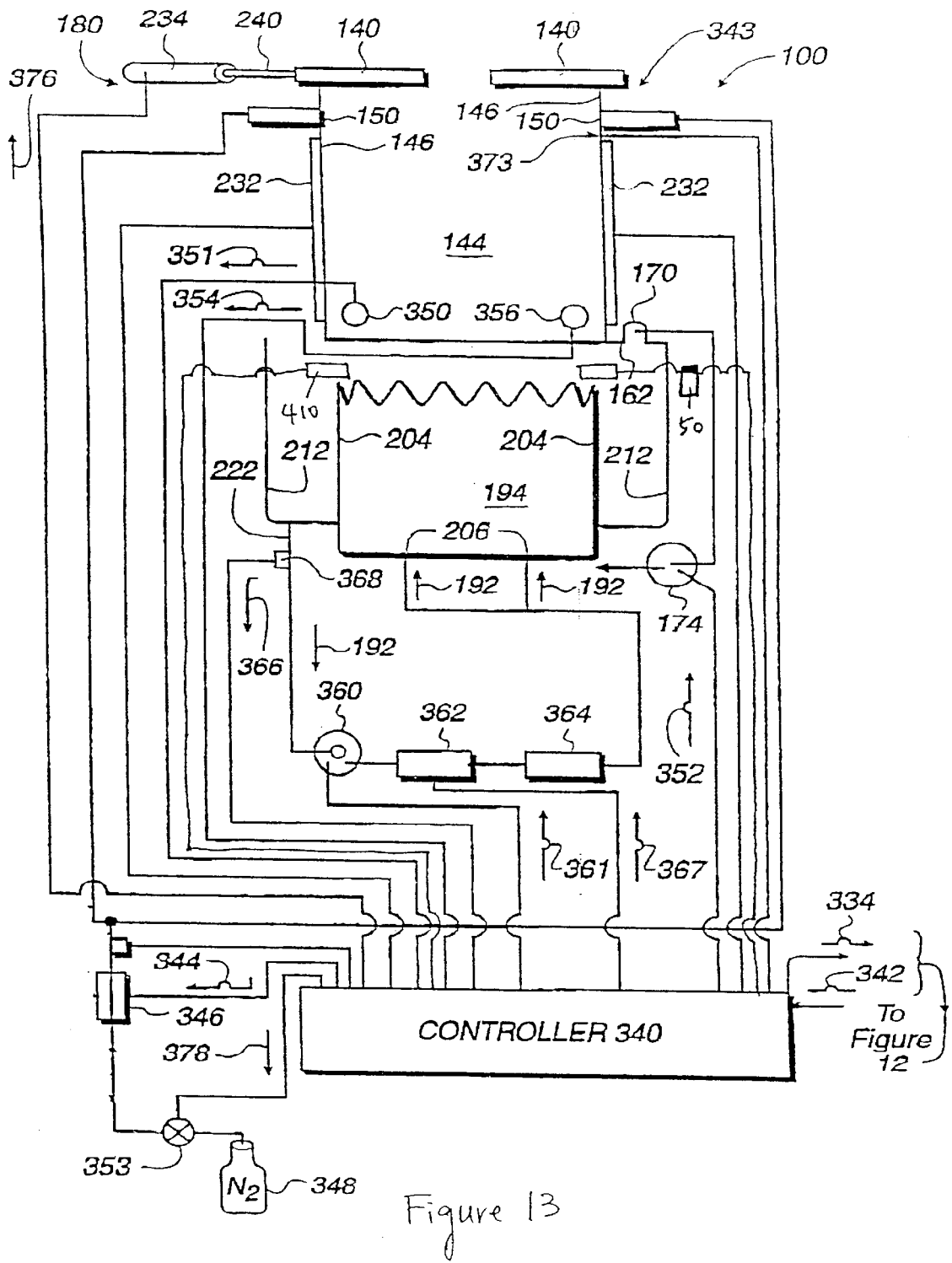
FIG. 13 is a schematic diagram of a control circuit that controls various operations of the dryer of FIG. 1.

Dryer 100 further includes a fluid outlet tank 212 around side walls 204 of bath 194 in order to contain the overflow of water 192 from bath 194. Outlet tank 212 is connected to sidewalls 204 of bath 194 and base 166 of chamber walls 146 and 148. Outlet tank 212 is open to the top to receive the overflow, and a pair of circulating drains 222 are provided at the bottom of the outlet tank 212 to drain the overflow of water 192 from outlet tank 212 to circulating pump 360 (FIG. 13). In addition, a standpipe 220 is connected to outlet tank to drain an excessive overflow of water 192 from outlet tank 212 to outside. The detailed structure of outlet tank 212 is explained below with reference to FIG. 7.

Heaters 232, which heat walls 146 and 148 of chamber 144, are flat electrical resistance heaters attached to walls 146 and 148 outside chamber 144. Heaters 232 are controlled to maintain the temperature of walls 146 and 148 of chamber 144 at a desired temperature so that thermal energy may be transferred to gas 160 to assist in maintaining gas 160 at a desired temperature.

Dryer 100 includes door 140, which is composed of door parts 140A and 140B, at the top of dryer 100. Door 140 opens when a disk delivery column 114 loads disks 104 from the top of dryer 100 into chamber 144. Then, when disks 104 are completely loaded into chamber 144, door 140 is closed with an opening through which disk delivery column 114 can move vertically. The clearance between door 140 and disk delivery column 114 is such that leakage of gas 160 from chamber 144 is minimized without interfering with vertical travel of disk delivery column 114.

Figure 5A:
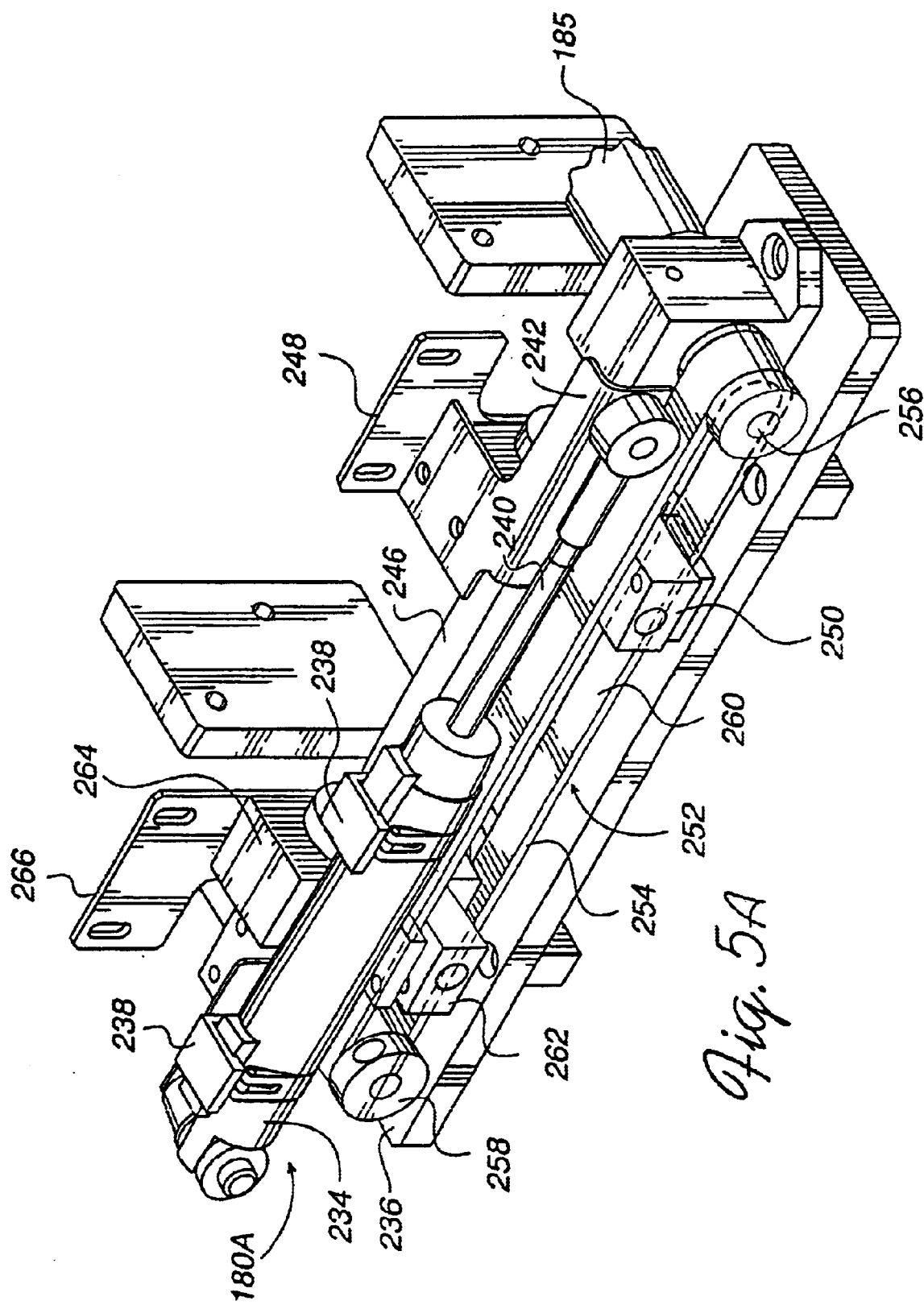
FIGS. 5A and 5B are perspective views of door opening portions of the dryer of FIG. 1.
Figure 5B:
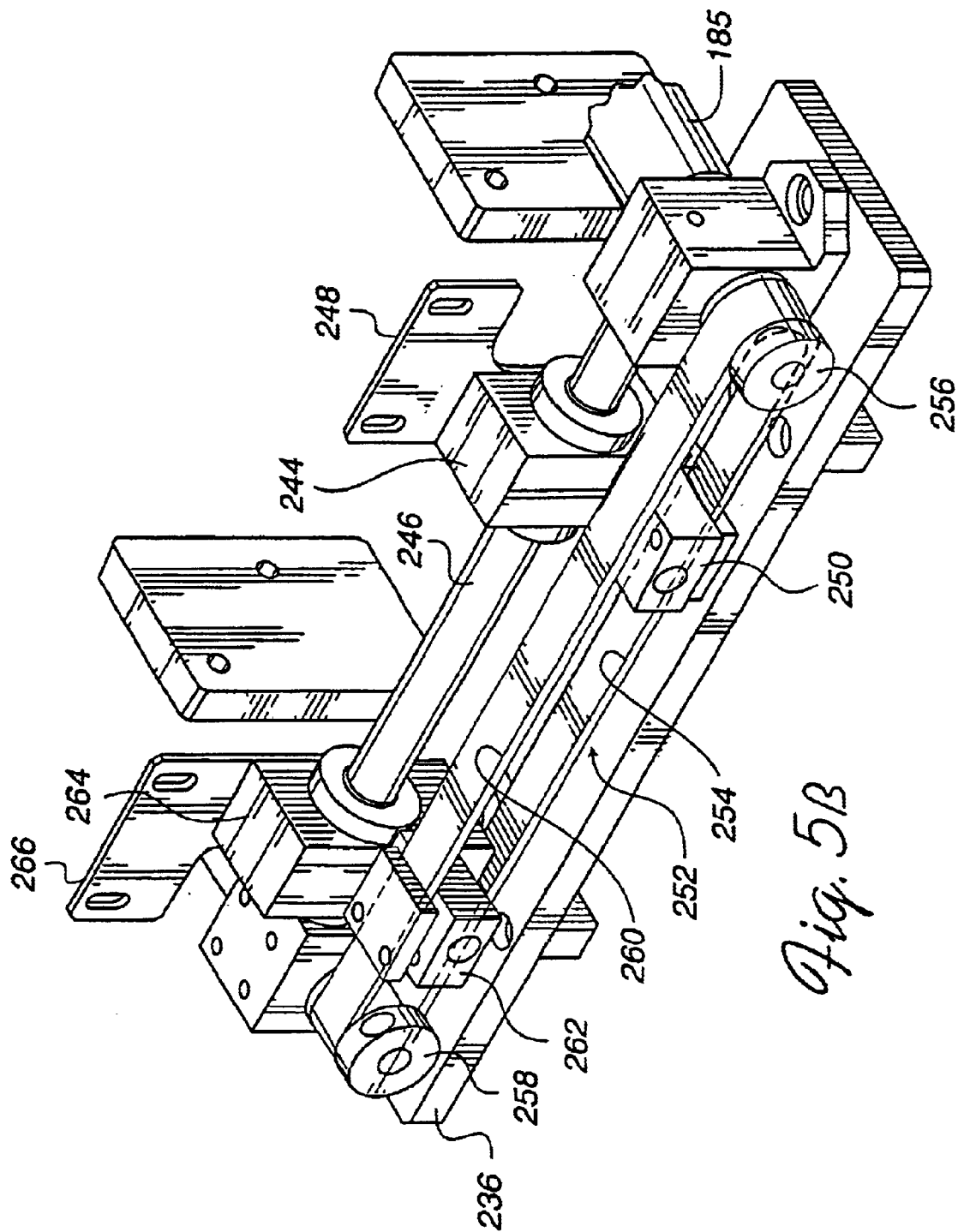

Dryer 100 further includes door control drives 180A and 180B. As shown in FIG. 4, door control drive 180B is disposed at the right end of dryer 100, and door control drive 180A is disposed at the left end of dryer 100. Door control drives 180A and 180B are connected to each other by a shaft 185 (FIG. 5A) to open and close door 140.

FIGS. 5A, 5B, and 6A to 6D illustrate operation of door control drive 180A. Door control drives 180A and 180B are identical to each other except that door control drive 180A has a pneumatic motor 234. Pneumatic motor 234 directly drives door control drive 180A and indirectly drives door control drive 180B through shaft 185.

Motor 234 is mounted at a fixed location relative to a frame 236 of dryer 100 by brackets 238, and drives piston rod 240 to move a front plate 242 connected to door part 140B through a door bracket 248. Front plate 242 is also secured to a front force transfer block 244 that rides on one of two door guides or guide rods 246 that extend back and forth along the transverse direction of dryer 100. As piston rod 240 moves toward the front, front block 244 moves toward the front on guide rods 246, and correspondingly front door bracket 248 and a lower belt clamp 250, which is connected to block 244, move toward the front. Lower belt clamp 250 is secured to a belt 252, which extends around two pulleys 256 and 258, and particularly to a lower length or run 254 of belt 252.

Pulley 256 is connected to shaft 185 such that rotation of pulley 256 makes shaft 185 rotate. The rotation of shaft 185 rotates a pulley of door control drive 180B, which is equivalent to pulley 256. Then, door control drive 180B opens and closes door parts 140A and 140B.

When lower length 254 of belt 252 travels forwardly, an upper run 260 of belt 252 moves toward the rear. Accordingly, an upper belt clamp 262 secured to upper run 260 of belt 252 moves backwards. A rear force transfer block 264, which is connected to upper belt clamp 262 and rides on guide rod 246, moves door part 140A that is connected to block 264 through brackets 266.

Accordingly, when piston rod 240 moves forward, door parts 140A and 140B move apart from each other, so that door 140 is opened. On the other hand, when piston rod 240 is driven backward by motor 234, door parts 140A and 140B moves toward each other, so that door 140 is closed.

FIG. 7 depicts the connection structure among bath 194, chamber 144, and organic compound delivery manifold 410. Exterior base 166 of chamber 144 extends along length L of chamber 144 and is provided with a series of gas outlets 162. Outer tank 212 is composed of an inner wall 282, an outer wall 280, and a bottom wall 284 to receive the overflow of water 192. Outer tank 212 further includes a tank flange 210, which extends from outer wall 280. Inner wall 282 of outer tank 212 is secured, for example, by welding, to sidewalls 204 of bath 194.

Organic compound delivery manifold 410 is inserted between tank flange 210 and an outer portion of base 166 by using gaskets 276A and 276B and a series of bolts 278A and 278B. Gaskets 276A and 276B can be made of PTFE sold under the trademark GORE-TEX. Thus, complete sealing is achieved between tank flange 210 and base 166.

FIG. 8 schematically illustrates gas supply system 154. Pipes 156 branch appropriately to supply gas 160 to gas inlets 150 of chamber 144 (FIG. 3). For ease of illustration, FIG. 8 shows gas inlets 150 at only one side of chamber 144.

The structure of each of gas inlets 150 is illustrated in FIGS. 9A to 9C. FIG. 9A shows in a plan view gas inlet 150 elongated in the direction of length L and having a curved rear wall 290 also extending longitudinally. Gas supply pipe 156 joins gas inlet 150 from a bottom 292 of gas inlet 150 and directs gas 160 against an opposite upper surface 294. Then, the gas flow is directed off upper surface 294 and curved rear wall 290 to the center (see line CL) of chamber 144 and is also spread longitudinally by the curved rear wall 290. As a result, gas inlets 150 spread gas 160 longitudinally and evenly across length L of chamber 144. Reference symbol GC, which is explained below, denotes gas curtains.

Figure 10A:
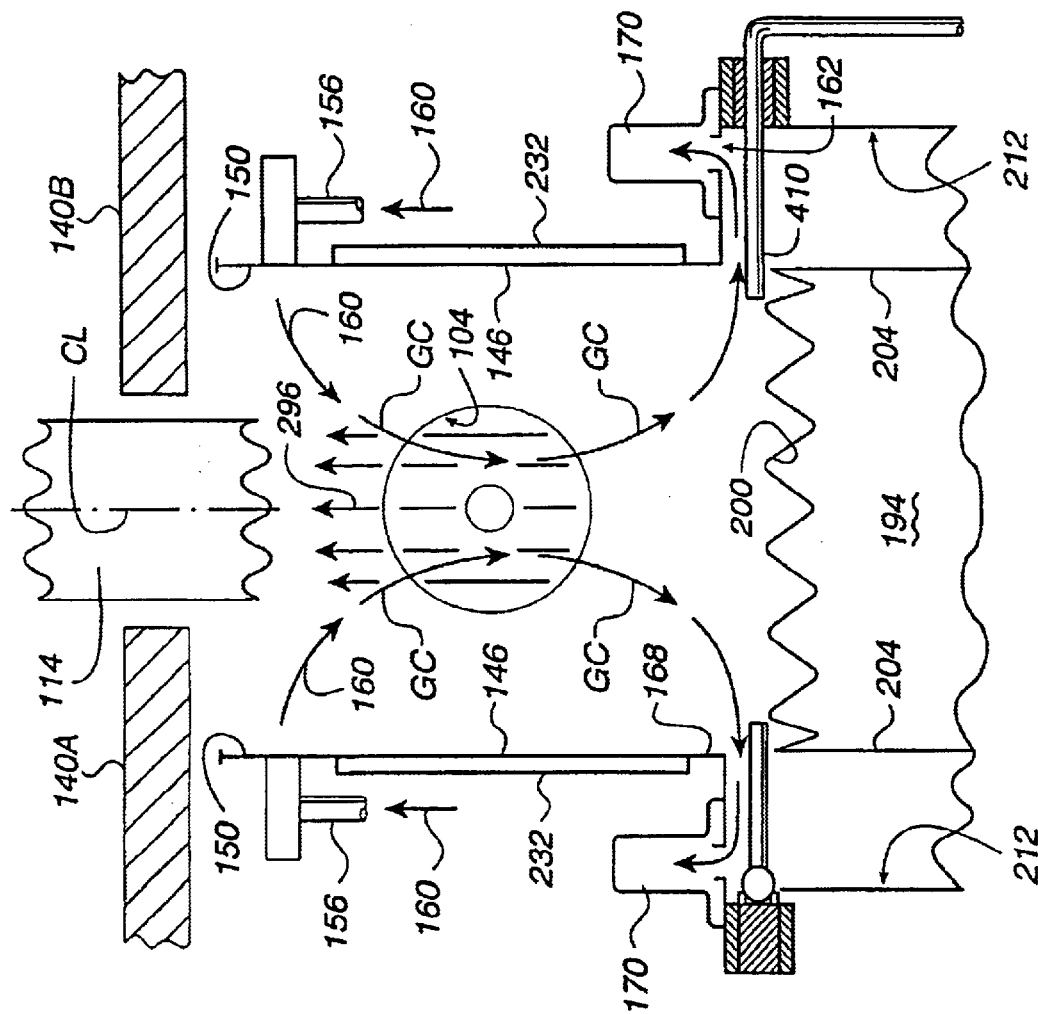
FIG. 10A illustrates the movement of gas and vapors inside the dryer of FIG. 1 during a drying

FIG. 10A illustrates the drying of substrates 104 by hot gas 160 while disks 104 are pulled from bath 194. Hot gas 160 flows downwardly from gas inlets 150 within chamber 144, defining gas curtains GC. When disks 104 are in the middle of chamber 144, gas curtains GC touch the surfaces of disk 104, so that a thin water film 392 (FIG. 16A) is evaporated by hot gas 160. Gas curtains GC carry the evaporated water vapors downwardly in chamber 144. Gas curtains GC also carry the water vapors evaporated from hot water 192 in bath 194 downwardly in chamber 144. Gas curtains GC carry remaining hydrofluoroether and isopropyl alcohol vapor downwardly in chamber 144. An exemplary organic compound delivery manifold 410 is shown in FIG. 10B.

In addition, while disks 104 are being removed from water 192, organic compound delivery manifold 410 spreads the mixture of hydrofluoroether and isopropyl alcohol vapor to the interfaces between disks 104 and water 192. The isopropyl alcohol increases the wettability of the surface of disks 104 and promotes the removal of water 192 from disks 104 by Marangoni principle. Hydrofluoroether, which is extremely hydrophobic, acts as water repelling agent, aiding the removal of water 192. Because hydrofluoroether temporarily forms a thin film on disks 104 before being dried, water vapor is prevented from condensing on disks 104.

Variable speed fan 174 (FIG. 3) operates at a speed selected to produce reduced gas pressure at the lower portion of chamber 144, so that gas curtains GC, after passing though disks 104, merge into gas outlets 162. Since gas curtains GC removes the water vapors and the remaining hydrofluoroether and isopropyl alcohol vapor from chamber 144 through gas outlets 162, chamber 144 can remain in dry condition although hot water 192 is prone to produce more water vapor than the room temperature water is.

Figure 11C:
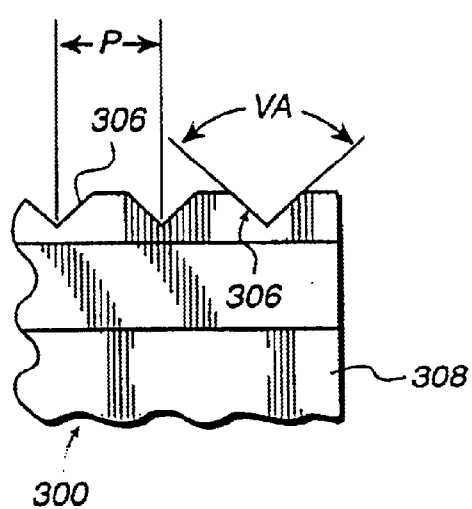

FIGS. 11A to 11D depict nest 106 of FIG. 2. Referring to FIG. 11A, nest 106 has three parallel bars 300 spaced apart from each other and is configured so as to minimize contact with disks 104 (FIG. 2). Bars 300 extend parallel to length L of chamber 144. A pair of opposed end plates 302 hold bars 300 in position, which is the same as parallel fingers 110 in FIG. 2. An upper surface 304 of each bar 300 has a saw tooth configuration having a series of V-shaped notches 306. Each notch 306 is configured to receive and hold a disk 104 in a vertical position while making minimal contact with the disk 104.

FIG. 11B shows one of bars 300. Bar 300 has an enlarged base 308 provided with holes 310 for receiving either a pin or a fastener 312 (FIG. 11A) to secure bar 300 to end plates 302. At the top of enlarged base 308, a thin substrate holder section 314 is shown having opposite parallel left and right sides 316 and 318. V-shaped notches 306 extend from left side 316 through thin section 314 to right side 318. Top surface 304 of bar 300 is beveled at an angle VB relative to a vertical plane.

Figure 11D:
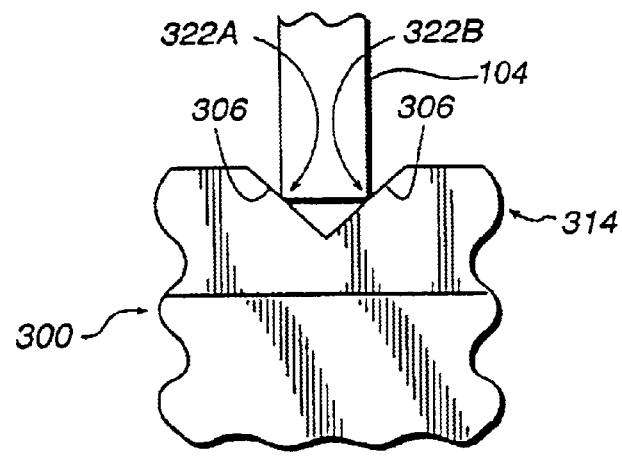

FIGS. 11C and 11D show that notch 306 has a V-shape having a notch angle VA. Additionally, a pitch P between two adjacent notches 306 is determined according to the thickness of disk 104. As a result of this configuration of notches 306, disk 104 touches notch 306 only at two points 322A and 322B. Two points 322A and 322B are at left side 316 of thin section 314 because notches 306 are beveled as shown in FIG. 11B. Further, any water 192 that is on disk 104 will tend to flow away from disk 104 to nest 106 through points 322A and 322B. Because the contact between nest 106 and disk 104 is minimized at points 322A and 322B and notches 306 are beveled, water 192 (FIG. 3) will not form a puddle or otherwise accumulate at points 322A or 322B while disk 104 is pulled from bath 194 (FIG. 3).

Angles VA and VB as well as pitch P are determined according to the shape and size of disk 104 or a substrate. For example, for a disk having a thickness of 0.80 mm and a diameter of 95 mm, angles VA and VB are about 190 degrees and 30 degrees, and pitch P is 0.25 inches.

Figure 12:
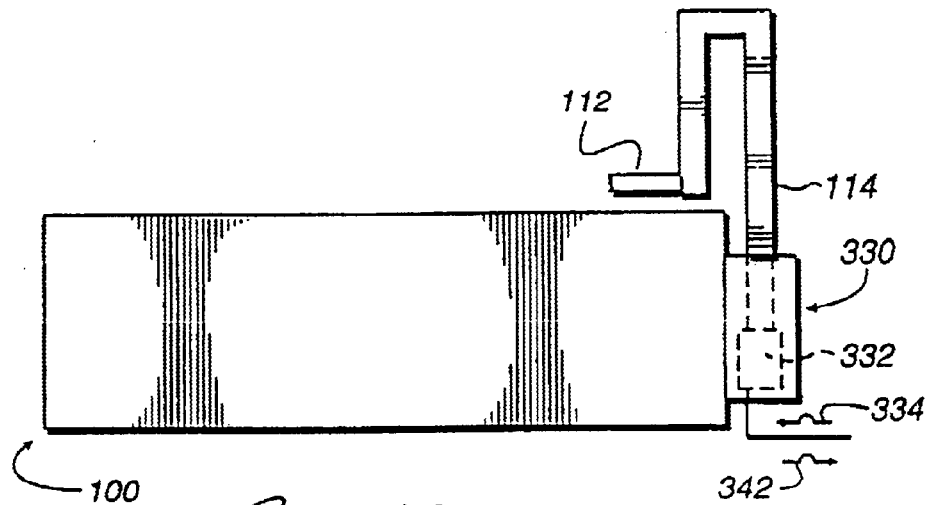
FIG. 12 illustrates an arm that carries disk carriers of the dryer of FIG. 1.

FIG. 12 shows the side of dryer, illustrating a drive 330 for moving main drive column 114 and arm 112 that carries nests 106. Drive 330 includes a servo motor 332 for moving main column 114 in response to signals 334 from a controller 340 (FIG. 13). Servo motor 332 may be a Model MACB231-NF40-C1 unit made by API Motion Inc., Amherst, N.Y., and having a lead screw (not shown) and a servo feedback loop (not shown) providing signals 342 to a controller 340. As described in more detail below, controller 340 causes servo motor 332 to operate at different speeds according to drying condition.

FIG. 13 is a schematic diagram of a control circuit 343 for controlling the operation of dryer 100. Controller 340 may be a programmable controller such as Model No. 2700 controller made by Control Technology Corporation, Hopkinton, Mass. Controller 340 controls heaters 232, variable speed fan 174, the flow of gas 160 through chamber 144, the flow of water 192 in bath 194, pneumatic motor 234 for door opening, servo motor 332 (FIG. 12), and organic compound delivery system 50.

In order to heat gas 160, controller 340 controls a heater 346 that heats gas 160 supplied from a gas tank 348 as well as heaters 232 that are attached to chamber 144. Controller 340 provides a control signal 344 to heater 346, and gas tank 348 preferably supplies inert gas 160, such as $N_2$ gas. After receiving signal 344, heater 346 heats gas 160 coming from gas tank 348, and then heated gas 160 is supplied to chamber 144 through gas inlets 150. For monitoring the temperature of gas curtain GC (FIG. 10), a temperature sensor 350 is provided in chamber 144 at about 0.83 inches above the bottom of chamber 144. Sensor 350 sends a feedback signal 351 to controller 340.

Controller 340 responds to signal 351 from sensor 350 and causes gas heater 346 and wall heaters 232 to maintain gas curtains GC at a desired temperature. The desired temperature depends on the temperature of water 192 in bath 194. The gas temperature measured by gas sensor 350 should be above the temperature of water 192 at the top surface thereof, preferably by 1 to 20° C. A difference of 10° C. between the water temperature and the gas temperature is more preferable. The difference should not be so high as to cause water 192 to boil. For example, for a gas curtain temperature of 90° C. measured by sensor 350, the temperature of the gas output from gas heater 346 may be about 170° C.

Controller 340 provides a control signal 352 to variable speed fan 174 that is connected to exhaust manifold 170. In response to an output signal 354 from a relative humidity sensor 356 positioned about one inch above the bottom of chamber 144, controller 340 adjusts the speed of fan 174 to control the relative humidity in chamber 144. For example, the relative humidity may be controlled below 50%.

Controller 340 controls the flow of gas 160 by regulating an output valve 353 attached to gas tank 348. In the drying operation, the gas flow may be 1 to 10 cubic feet per minute (CFM). The gas flow rate varies depending on the type and the number of disks 104 to be dried. When disks 104 are introduced to chamber 144 and moved into bath 194, controller 340 may decrease the gas flow rate to the lower end of the range so that gas curtains GC will not cause water 192 in bath 194 to splash or otherwise be disturbed.

Controller 340 controls organic compound delivery system 50. When substrates 104 are pulled from bath 194, controller 340 cause organic compound delivery system 50 to produce a mixture of hydrofluoroether and isopropyl alcohol carried by a carrier gas and to supply the mixture into chamber 144 through organic compound delivery manifold 410. FIG. 13 does not show the bubbler that produces the mixture.

Controller 340 controls the flow rate of water 192 in bath 194. For this purpose, controller 340 may send a signal 361 to a pump 360 that receives circulated water 192 from a circulating drain 222, and supplies the received water 192 to a fluid heater 362 that heats water 192 before water 192 is supplied to bath 194. The heated water 192 passes through a filter 364 before being supplied to bath 194 through water inlets 206. Filter 364 may be a 0.05 micron PTFE filter made by Pall Corporation in East Hills, N.Y. It is preferable that filter 364 is designed to leave in the filtered water 192 only five 0.03 micron particles per cubic centimeter of the filtered water 192.

A temperature sensor 368 attached to circulating drain 222 measures the temperature of water 192 at circulating drain 222 and sends a signal 366 to controller 340 to notify the water temperature. Then, controller 340 provides a signal 367 to liquid heater 362 to maintain water 192 in bath 194 in the desired temperature range.

Controller 340 controls pneumatic motor 234 that opens and closes door 140. At the start of a drying cycle, controller 340 sends a signal 376 to cause motor 234 to move piston rod 240 to open door 140. Then, controller 340 sends signal 334 to servo motor 332 (FIG. 12) to load nest 106 (FIG. 2) into chamber 144 and bath 194. When nest 106 containing disks 104 is positioned in a proper position, servo motor 332 sends signal 334 to controller 340, and then controller 340 actuates motor 234 to close door 140. At the end of the drying cycle, when nest 106 has been positioned in chamber 144 just below door 140, signal 342 is provided from servo motor 332 to controller 340. In response, controller 340 generates signal 376 to cause motor 234 to open door 140.

Another function of controller 340 is to activate an anti-static device 373 that creates a charge at the points at which gas 160 is introduced into inlets 150 to prevent static charge from existing in chamber 144. Anti-static device 373 ionizes gas 160, so that the ionized gas 160 neutralizes any charge and prevent charge build-up. Anti-static device 373 can be purchased from Simco Static Control & Cleanroom in Hatfield, Pa.

As described above, controller 340 controls servo motor 332. At the beginning of a drying cycle, after door 140 is opened, controller 340 receives feedback signal 342 from servo motor 332 indicating that arm 112 (FIG. 12) is up above chamber 144. Controller 340 then causes servo motor 332 to lower nest 106 containing disks 104 into chamber 144 and then into bath 194 until substrates 104 are fully immersed in water 192 in bath 194. Servo motor 332 sends signal 342 to controller 340 when nest 106 has moved lower than door 140. In response, controller 340 causes motor 234 to close door 140. Servo motor 332 further sends signal 342 to indicate the full immersion of disks 104, and in response controller 340 sends signal 334 causing servo motor 332 to stop. Controller 340 may then cause servo motor 332 to pull nest 106 upwardly from bath 194 to chamber 144, and eventually out of chamber 144 in coordination with operation of door 140.

Figure 14:
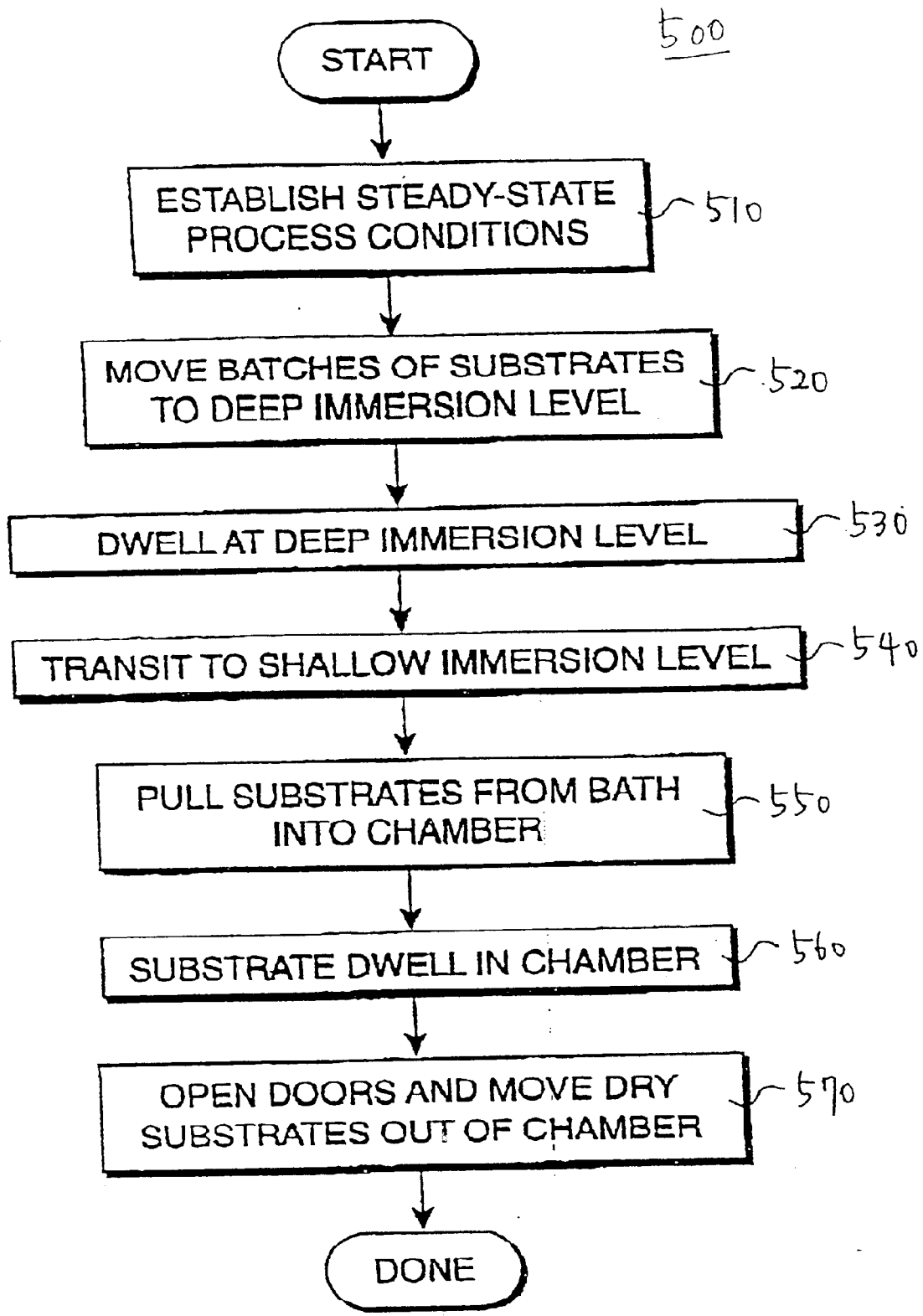
FIG. 14 is a flow chart of a disk drying process in accordance with another embodiment of the present invention.

FIG. 14 shows a flow chart of an example of a disk drying process 500 in dryer 100 of FIG. 1 in accordance with the present invention. Referring to FIGS. 13 and 14, process 500 starts with establishing steady-state process conditions (step 510). Step 510 includes: determining the process conditions, such as gas flow rate, gas temperature, water flow rate, water temperature, and relative humidity inside chamber 144; and turning on heater 232, sensors 350, 356, 368, and 370, and fan 174. Controller 340 is programmed to set up the process conditions.

After the steady-state process conditions are established, disks 104 are deeply immersed into water 192 of bath 194 (step 520). In step 520, controller 340 sends signal 376 to motor 234 to cause motor 234 to open door 140. Nests 106 containing disks 104 are loaded on arm 112, which is above door 140. Nitrogen valve 353 is set by a signal 378 from controller 340 to provide the low gas flow rate described above. Then, controller 340 causes servo motor 332 to lower disks 104 into chamber 144. The servo motor 332 sends signal 342 to controller 340 indicating that disks 104 have passed door 140. Controller 340 then causes motor 234 to close door 140. The door closing can occur either when disks 104 are still in chamber 144 or when deeply immersed in bath 194.

After disks 104 are immersed into the deep immersion position depth as shown in FIG. 15A, disks 104 dwell at the position for the cleaning of disks 104 (step 530). In step 530, servo motor 332 sends signal 342 to controller 340 indicating that disks 104 are at the deep immersion depth, which is at least one inch below the top surface of water 192 in bath 194. In response, controller 340 causes servo motor 332 to stop or dwell, and via valve 353, causes the gas flow rate to be increased to the preferred amount for drying. During step 530, pump 360 circulates water 192 for 5 to 90 seconds to allow water 192 in bath 194 to flow over substrates 104 and remove any particles (not shown) remaining on disks 104, and the temperature of water 192 is set at 30 to 80° C. While disks 104 are cleaned, the temperature of gas 160 in chamber 144 is raised to 40 to 90° C., and the relative humidity in chamber 144 is kept below 50%.

At the end of the dwelling or cleaning period, disks 104 are pulled upward to a shallow immersion depths, which is 0.1 to 1.0 inch below the top surface of water 192, as shown in FIG. 15B (step 540). This transit takes about less than two seconds. In addition, organic compound delivery manifold 410 (FIG. 3) begins to supply the mixture of hydrofluoroether and isopropyl alcohol vapor along the top surface of water 192.

After step 540 is completed, disks 104 are pulled from bath 194 into chamber 144 (step 550), as shown in FIG. 15C, at a constant rate, for example, about 0.5–2.5 mm/sec. To establish proper conditions for pulling disks 104 out of water 192, controller 340 sends signal 361 to fluid pump 360 to stop the circulation of water 192. Controller 340 continues to monitor the temperature and relative humidity in chamber 144 and to maintain the desired temperature and relative humidity described with respect to step 530. Organic compound delivery manifold 410 (FIG. 3) continues to supply the mixture of hydrofluoroether and isopropyl alcohol vapor along the top surface of water 192.

Figure 16A:
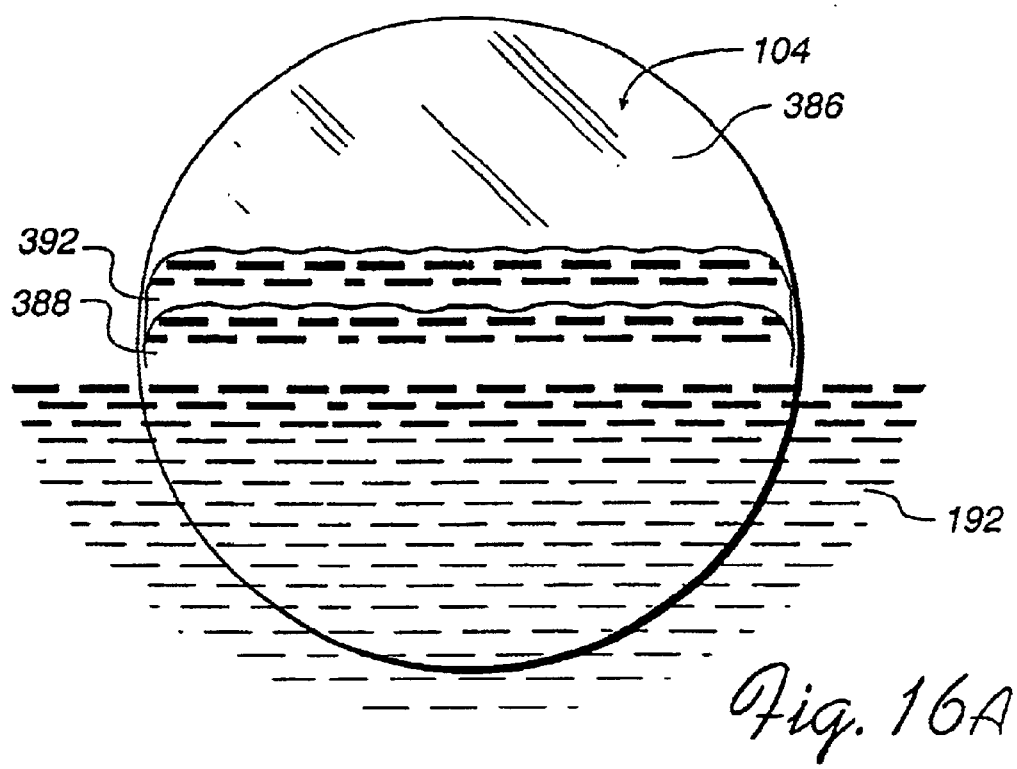
FIGS. 16A and 16B illustrate the formation of a thin water film and a meniscus at the interface between the disk and the water bath during the drying process of FIG. 14.
Figure 16B:
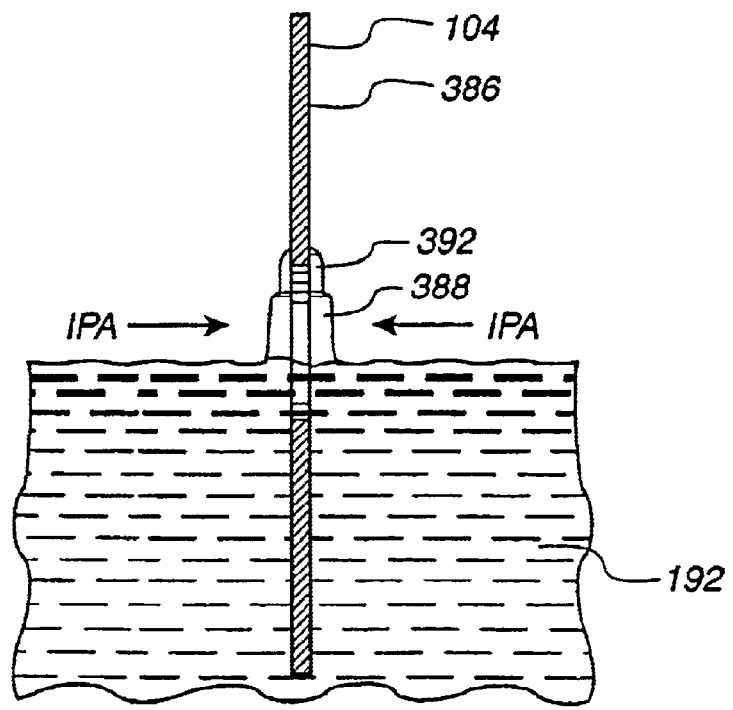

FIGS. 16A and 16B show the interface between water 192 and disk 104 while disk 104 is pulled from bath 194 in step 540. The portion of disk 104 above the top surface of water 192 is composed of a dried surface 386, a surface having a thin water film 392 thereon, and a surface having a water meniscus 388 thereon. Water film 392 and meniscus 388 are formed on both surfaces of disk 104. Meniscus 388 is formed on disk 104 right after disk 104 is pulled from water 192 at the interface between disk 104 and water 192. As disk 104 is further pulled from water 192, meniscus 388 becomes water film 392, and water film 392 is dried by hot gas 160 (FIG. 3). Thus, water film 392 exists above meniscus 388.

The isopropyl alcohol vapor increases the wettability of disks 104 and promotes removal of water 192 from disk 104. The isopropyl alcohol vapor dissolves into the top surface of water 192 and forms a mixture of water and isopropyl alcohol, so that the surface tension of the top portion of water 192 becomes lower than that of the portion of water 192 remote from the water/isopropyl alcohol mixture. This surface tension difference causes water 194 to flow from the low surface tension region to the high surface tension region. That is, the surface tension difference between water 192 and the water/isopropyl alcohol mixture promotes the separation of water 192 from disk 104.

Hydrofluoroether vapor further promotes the separation of water 192 from disk 104. The hydrofluoroether is extremely hydrophobic and acts as water displacing agent. The hydrofluoroether vapor does not dissolve into water 192, and instead, after depositing on disk 104, penetrates between water film 392 and disk 104 and remains on disk 104 until being evaporated. The presence of hydrofluoroether on disk 104 prevents the condensation of water vapor on disk 104. The quantity of hydrofluoroether used in this embodiment is far smaller that that used in the prior art hydrofluoroether process, and thus the recovery of used hydrofluoroether is unnecessary. In addition, the water displacing effect of hydrofluoroether can reduce the quantity of isopropyl alcohol, which is flammable, required for drying disk 104.

The height of meniscus 388 is typically less than 1 mm from the top surface of water 192. The height of water film 392 is typically 0.005–0.5 mm from the boundary between water film 392 and meniscus 388. In step 550, water film 392 may exist only for a very brief period, e.g., 0.001–0.6 sec., before water film 392 evaporates in chamber 144. Rapid evaporation of water film 392, which leaves no stains on disk 104, is desirable.

The disk pulling rate is determined by the type of disk and the type of fluid in bath 194, which is water 192 in this embodiment, and must allow the continuous formation of meniscus 388 and water film 392. If the disk pulling rate is too high, meniscus 388 and water film 392 becomes discontinuous. This discontinuity causes non-uniform wetting of disk 104. Accordingly, undesirable uneven drying and staining of disk 104 may occur. In addition, as described above, in order to avoid condensation of water vapor on disk 104, controller 340 continues to monitor the relative humidity in chamber 144 and to control the speed of fan 174 so as to remove gas 160 including water vapor from chamber 144.

After being completely pulled out of water 192, disk 104 is positioned and dwells in chamber 144 just below door 140, as shown in FIG. 15D (step 560). The dwelling time may vary from zero to fifteen seconds, depending on the nature of the fluid in bath 194. In case of de-ionized heated water 192, for example, the dwelling time may be very short (e.g., zero or a mere pause to allow door 140 to be opened). In the case of fluids other than de-ionized water, a longer dwelling time may be used if the fluids are not easily dried during step 550.

After step 560, controller 340 sends signal 376 to motor 234 to cause motor 234 to open door 140. Controller 340 also sends signal 334 causing servo motor 332 to pull nest 106 containing dried disks 104 completely from chamber 144, at which time disk drying process 500 is completed.

In drying a substrate, the drying process of the present invention increases the wettability of the substrates and promotes the separation of water or fluid from the substrate and dries the substrate by transferring of thermal energy to the substrate. The mixture of hydrophobic organic compound vapor and polar organic compound vapor supplied to the interface between the substrate and the fluid promotes the separation of water or fluid from the substrate. The polar organic compound vapor dissolves into the top surface of the fluid in the bath, and by reducing the surface tension of the top surface of the fluid, promotes the removal of the fluid from the substrate while the substrate is pulled from the fluid in the bath. That is, the surface tension difference between the bulk fluid and the polar organic compound/fluid mixture promotes the separation of the fluid from the substrate. Further, the polar organic compound vapor increases the wettability of the substrates.

The hydrophobic organic compound vapor further promotes the separation of the fluid from the substrate. The hydrophobic organic compound vapor does not dissolve into the fluid, and instead, after depositing on the substrate, penetrates between the fluid film formed on the substrate and remains on the substrate until being evaporated. The presence of hydrophobic organic compound on the substrate prevents the condensation of water vapor on the substrate.

The thermal energy for drying the substrate is provided from several sources. Initially, the hot fluid in the bath provides thermal energy to the substrate. Mainly, heated gas flowing in the chamber supplies thermal energy to remove the fluid remaining on the substrate. Further, the heater on the chamber wall supplies thermal energy into the chamber.

The present invention can increase the efficiency of drying process. The combination of the enhanced wettability and the fluid removal by the mixture of hydrophobic and polar organic compound vapors, the use of hot fluid, and the controlled gas drying can shorten total drying time. Further, since the concentration of the mixture of hydrophobic and polar organic compound vapors at the interface between the fluid and the substrate is constant through the substrate removal from the fluid, the drying process is uniform and stable.

The humidity and temperature controlled environment in the chamber prevents the condensation of water vapor on the substrate that has been dried. When heated gas flows in the chamber from the gas inlet to gas outlet, the heated gas forms gas curtains that pick up and carry out of the chamber the water vapor evaporated from the heated water of the bath and the remaining hydrophobic and polar organic compound vapors that have encountered the substrate. Accordingly, the humidity in the chamber can be kept low, and the condensation can be avoided. Further, since the remaining hydrophobic and polar organic compound vapors are constantly removed and new hydrophobic and polar organic compound vapors are constantly supplied, the desired partial pressure of the hydrophobic and polar organic compound vapors can constantly kept low, so that stable drying process can be achieved.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A method of drying a substrate, comprising:

immersing a substrate into a fluid contained in a bath;

removing the substrate from the fluid into a chamber; and supplying polar organic compound and hydrophobic organic compound into the chamber, wherein the temperature of the fluid in the bath is between 30° C. and 80° C.

2. A method of drying a substrate as in claim 1, wherein the fluid is de-ionized water.

3. The method of drying a substrate as in claim 1, wherein ratio of the polar organic compound to the hydrophobic organic compound supplied into the chamber is between 1:999 and 1:9.

4. A method of drying a substrate, comprising:

immersing a substrate into a fluid contained in a bath;

removing the substrate from the fluid into a chamber, and supplying polar organic compound and hydrophobic organic compound into the chamber, and heating the fluid such that the temperature of the fluid in the bath is between 30° C. and 80° C.

5. A method of drying a substrate, comprising;

immersing a substrate into a fluid contained in a bath;

removing the substrate from the fluid into a chamber; and supplying polar organic compound and hydrophobic organic compound into the chamber; and supplying a gas into the chamber to dry the substrate.

6. The method of claim 5, further comprising:

heating the gas before supplying the gas into the chamber.

7. The method of claim 6, further comprising:

removing the gas, remaining hydrophobic organic compound, remaining polar organic compound, and fluid vapor evaporated from the fluid so that temperature and humidity in the chamber are controlled.

8. The method of claim 7, wherein the temperature in the chamber is controlled to be between 1° C. and 20° C. above temperature of the fluid in the bath.

9. The method of claim 7, wherein the humidity in the chamber is controlled to be below 50% relative humidity.

10. The method of claim 7, wherein removing the gas is performed by a variable speed fan.

11. The method of drying a substrate as in claim 5, which includes the step of;

heating the chamber to transfer thermal energy into the chamber.

12. A method of drying a substrate, comprising:

immersing a substrate into a fluid contained in a bath;

removing the substrate from the fluid into a chamber; and supplying polar organic compound and hydrophobic organic compound into the chamber; and mixing the polar organic compound and the hydrophobic organic compound before supplying the polar organic compound and the hydrophobic organic compound into the chamber.

13. The method of claim 12, wherein the polar organic compound and the hydrophobic organic compound are included in a mixture with a carrier gas.

14. The method of claim 1, wherein the carrier gas is nitrogen gas.

15. A method of drying a substrate, comprising:
immersing a substrate into a fluid contained in a bath;
removing the substrate from the fluid into a chamber; and
supplying polar organic compound vapor and hydrophobic organic compound vapor different than said polar organic compound vapor into the chamber said vapors are supplied to an interface between the substrate and the fluid, the interface being a boundary between a portion of the substrate out of the fluid and a portion of the substrate in the fluid.

16. The method of claim 15, wherein the polar organic compound is one selected from a group consisting of isopropyl alcohol, acetone, and methanol.

17. The method of claim 15, wherein the hydrophobic organic compound is one selected from a group consisting of hydrofluoroether, perfluorocarbon, and hydrofluorocarbon.

18. The method of claim 15, wherein the polar organic compound is supplied horizontally.

19. The method of claim 15, wherein the polar organic compound is included in a mixture that comprises a carrier gas.

20. The method of claim 19, wherein the carrier gas is nitrogen gas.

21. The method of claim 15, wherein the hydrophobic organic compound is supplied horizontally.

22. The method of claim 15, wherein the hydrophobic organic compound is included in a mixture that comprises a carrier gas.

23. The method of claim 22, wherein the carrier gas is nitrogen gas.

24. The method of claim 15, wherein the speed of removing the substrate is between 0.5 mm/sec and 2.5 mm/sec.

25. A method of drying a substrate, comprising:
immersing a substrate into a fluid contained in a bath;
removing the substrate from the fluid into a chamber; and
supplying polar organic compound and hydrophobic organic compound into the chamber to an interface between the substrate and the fluid, the interface being a boundary between a portion of the substrate out of the fluid and a portion of the substrate in the fluid; and
removing from the chamber remaining hydrophobic organic compound, remaining polar organic compound, and fluid vapor evaporated from the fluid.

26. A method of drying a substrate, comprising:
immersing a substrate into a fluid contained in a bath;
removing the substrate from the fluid into a chamber; and
supplying polar organic compound and hydrophobic organic compound into the chamber;
circulating the fluid into and out of the bath; and
filtering the fluid before the fluid is supplied into the bath.

27. An apparatus for drying a substrate, comprising:
a bath containing a fluid;
a chamber;
a polar organic compound delivery system supplying a polar organic compound into the chamber; and
a hydrophobic organic compound delivery system supplying a hydrophobic organic compound into the chamber,
wherein the polar organic compound delivery system is between the chamber and the bath.

28. An apparatus for drying a substrate, comprising:
a bath containing a fluid;
a chamber;
a polar organic compound delivery system supplying a polar organic compound into the chamber; and
a hydrophobic organic compound delivery system supplying a hydrophobic organic compound into the chamber,
wherein the hydrophobic organic compound delivery system is between the chamber and the bath.

29. An apparatus for drying a substrate, comprising:
a bath containing a fluid;
a chamber;
a polar organic compound delivery system supplying a polar organic compound into the chamber; and
a hydrophobic organic compound delivery system supplying a hydrophobic organic compound into the chamber,
wherein the hydrophobic organic compound is included in a mixture that comprises a carrier gas.

30. The apparatus of claim 29, wherein the carrier gas is nitrogen gas.

31. An apparatus for drying a substrate, comprising:
a bath containing a fluid;
a chamber;
a polar organic compound delivery system supplying a polar organic compound into the chamber;
a hydrophobic organic compound delivery system supplying a hydrophobic organic compound into the chamber; and
a fluid heater that heats the fluid.

32. The apparatus of claim 31, wherein the fluid heater heats the fluid such that temperature of the fluid is between 30° C. and 80° C.

33. An apparatus for drying a substrate, comprising:
a bath containing a fluid:
a chamber;
a polar organic compound delivery system supplying a polar organic compound into the chamber;
a hydrophobic organic compound delivery system supplying a hydrophobic organic compound into the chamber; and
a chamber environment control system that supplies a gas into the chamber to dry the substrate.

34. The apparatus of claim 33, wherein the gas is heated before being supplied into the chamber.

35. The apparatus of claim 33, wherein the chamber environment control system comprises:
a gas inlet through which the gas is supplied into the chamber;
a gas outlet though which the gas, remaining hydrophobic organic compound, remaining polar organic compound, and fluid vapor evaporated from the fluid are removed from the chamber; and
a gas heater that heats the gas before the gas supplied into the chamber,
wherein the chamber environment control system controls temperature and humidity in the chamber.

36. The apparatus of claim 35, wherein the gas inlet in at a top portion of the chamber and the gas outlet is at the bottom portion of the chamber.

37. The apparatus of claim 35, further comprising:
a fan connected to the gas outlet to draw the gas from the chamber.

38. The apparatus of claim 37, wherein the fan is a variable speed fan so that drawing rate of the gas is controlled by controlling speed of the variable speed fan.

39. The apparatus of claim 35, wherein the temperature in the chamber is controlled to be between 1° C. and 20° C. above temperature of the fluid in the bath.

40. The apparatus of claim 35, wherein the humidity in the chamber is controlled to below 50% relative humidity.

41. An apparatus for drying a substrate, comprising:
a bath containing a fluid;
a chamber;
a polar organic compound delivery system supplying a polar organic compound vapor into the chamber;
a hydrophobic organic compound delivery system supplying a hydrophobic organic compound vapor that is different than the said polar organic compound vapor into the chamber; and
said delivery system for each said polar organic compound vapor and said hydrophobic organic compound vapor supply the respective vapors to an interface between the substrate and the fluid while the substrate is being removed from the fluid of the bath into the chamber, the interface home a boundary between a portion of the substrate out of the fluid and a portion of the substrate in the fluid.

42. The apparatus of claim 41, wherein the fluid is de-ionized water.

43. The apparatus of claim 41, wherein the polar organic compound is selected from a group consisting of isopropyl alcohol, acetone, and methanol.

44. The apparatus of claim 41, wherein the hydrophobic organic compound is selected from a group consisting of hydrofluoroether, perfluorocarbon, and hydrofluorocarbon.

45. The apparatus of claim 41, wherein the ratio of the polar organic compound to the hydrophobic organic compound supplied into the chamber is between 1:999: and 1:9.

46. The apparatus of claim 41, wherein the polar organic compound delivery system and the hydrophobic organic compound delivery system are integrated into a single delivery system that supplies a mixture including the polar organic compound and the hydrophobic organic compound.

47. The apparatus of claim 46, wherein the mixture also includes a carrier gas.

48. The apparatus of claim 47, wherein the carrier gas is nitrogen gas.

49. The apparatus of claim 41, wherein the polar organic compound delivery system supplies the polar organic compound horizontally.

50. The apparatus of claim 41, wherein the hydrophobic organic compound delivery system supplies the hydrophobic organic compound horizontally.

51. The apparatus of claim 41, wherein the polar organic compound is included in a mixture that comprises a carrier gas.

52. The apparatus of claim 51, wherein the carrier gas is nitrogen gas.

53. The apparatus of claim 41, further comprising:
a fluid circulation system that circulates the fluid in the bath.

54. The apparatus of claim 53, wherein the fluid circulation system comprises:
a pump circulating the fluid into and out of the bath: and
a filter through which the fluid from the bath passes before being supplied into the bath.

55. The apparatus of claim 54, which includes a fluid heater connected to the fluid circulation system.

56. The apparatus of claim 41, further comprising:
a substrate transfer system that transfer the substrate into and out of the fluid of the bath.

57. The apparatus of claim 41, further comprising:
a chamber heater attached to the chamber to transfer thermal energy in to the chamber.

58. The apparatus of claim 41, further comprising:
an overflow tank receiving overflow of the fluid from the bath.

59. The apparatus of claim 41, further comprising:
an outlet through which remaining hydrophobic organic compound, remaining polar organic compound, and fluid vapor evaporated from the fluid are removed from the chamber.

60. An apparatus for drying a substrate, comprising:
a bath containing a fluid;
a chamber;
a polar organic compound delivery system supplying a polar organic compound into the chamber;
a hydrophobic organic compound delivery system supplying a hydrorphobic organic compound into the chamber;
said delivery system for each said polar organic compound vapor and said hydrophobic organic compound vapor supply the respective vapors to an interface between the substrate and the fluid while the substrate is being removed from the fluid of the bath into the chamber, the interface being a boundary between a portion of the substrate out of the fluid and a portion of the substrate in the fluid; and
a substrate transfer system that transfers the substrate into and nut of the fluid of the bath, wherein the substrate transfer system comprises:
a nest containing the substrate therein; and
an arm to which the nest is connected, the arm moving so that the substrate in the nest is immersed into and removed from the fluid of the bath.

* * * * *